US010858519B2

(12) United States Patent
Haraguchi et al.

(10) Patent No.: US 10,858,519 B2
(45) Date of Patent: Dec. 8, 2020

(54) NEAR-INFRARED ABSORBING COMPOSITION FOR SOLID-STATE IMAGING DEVICE AND FILTER

(71) Applicants: TOYO INK SC HOLDINGS CO., LTD., Tokyo (JP); TOYOCOLOR CO., LTD., Tokyo (JP); TOPPAN PRINTING CO.,LTD, Tokyo (JP)

(72) Inventors: Kazumichi Haraguchi, Tokyo (JP); Kazunori Yamada, Tokyo (JP); Masahiro Kubo, Tokyo (JP); Koichi Minato, Tokyo (JP)

(73) Assignees: TOYO INK SC HOLDINGS CO., LTD., Tokyo (JP); TOYOCOLOR CO., LTD., Tokyo (JP); TOPPAN PRINTING CO., LTD, Tokyo (JP)

( * ) Notice: Subject to any disclaimer, the term of this patent is extended or adjusted under 35 U.S.C. 154(b) by 0 days.

(21) Appl. No.: 16/033,229

(22) Filed: Jul. 12, 2018

(65) Prior Publication Data

US 2018/0319989 A1 Nov. 8, 2018

Related U.S. Application Data

(63) Continuation of application No. PCT/JP2017/000858, filed on Jan. 12, 2017.

(30) Foreign Application Priority Data

Jan. 15, 2016 (JP) .................. 2016-006293

(51) Int. Cl.
| C09B 57/00 | (2006.01) |
| H01L 27/14 | (2006.01) |
| H01L 27/146 | (2006.01) |
| G02B 5/20 | (2006.01) |
| G02B 5/22 | (2006.01) |
| C09B 47/04 | (2006.01) |
| G02B 5/28 | (2006.01) |

(52) U.S. Cl.
CPC ............ *C09B 57/002* (2013.01); *C09B 47/04* (2013.01); *C09B 57/007* (2013.01); *G02B 5/208* (2013.01); *G02B 5/22* (2013.01); *G02B 5/223* (2013.01); *G02B 5/281* (2013.01); *H01L 27/14* (2013.01); *H01L 27/1462* (2013.01)

(58) Field of Classification Search
CPC combination set(s) only.
See application file for complete search history.

(56) References Cited

U.S. PATENT DOCUMENTS

| 5,670,083 A * | 9/1997 | Akashi ............... C09K 19/3852 |
| | | 252/299.01 |
| 8,728,687 B2 * | 5/2014 | Kaneko .............. C08G 73/0206 |
| | | 430/7 |
| 2010/0038606 A1 * | 2/2010 | Inoue ..................... B82Y 30/00 |
| | | 252/586 |
| 2010/0092885 A1 | 4/2010 | Ito et al. |
| 2011/0003241 A1 | 1/2011 | Kaneko et al. |
| 2013/0034812 A1 * | 2/2013 | Shimada .................. G03F 1/56 |
| | | 430/280.1 |
| 2015/0146057 A1 | 5/2015 | Konishi et al. |
| 2015/0277002 A1 | 10/2015 | Ezoe et al. |
| 2015/0293282 A1 | 10/2015 | Takishita et al. |

FOREIGN PATENT DOCUMENTS

| CN | 101925636 | 12/2010 |
| CN | 102279526 | 12/2011 |
| CN | 103207522 | 7/2013 |
| CN | 104327212 | 2/2015 |
| CN | 104755969 | 7/2015 |
| CN | 104884537 | 9/2015 |
| CN | 104937452 | 9/2015 |
| JP | H0578364 | 3/1993 |
| JP | H05247437 | 9/1993 |
| JP | H0625548 | 2/1994 |
| JP | H06107663 | 4/1994 |
| JP | H1078509 | 3/1998 |
| JP | 2000026748 | 1/2000 |
| JP | 2000063691 | 2/2000 |
| JP | 2000162431 | 6/2000 |
| JP | 2001106689 | 4/2001 |
| JP | 2003096040 | 4/2003 |
| JP | 2004018561 | 1/2004 |
| JP | 2005325292 | 11/2005 |
| JP | 2007219114 | 8/2007 |
| JP | 2008091535 | 4/2008 |
| JP | 2010506016 | 2/2010 |
| JP | 2010072575 | 4/2010 |

(Continued)

OTHER PUBLICATIONS

"International Search Report (Form PCT/ISA/210) of PCT/JP2017/000858," dated Apr. 18, 2017, with English translation thereof, pp. 1-4.

International Preliminary Report on Patentability; this report contains the following items :Form PCT/IB/338, PCT/IB/373, PCT/ISA237(cover sheet), PCT/ISA237(Box No. I),PCT/ISA237(Box No. V), dated Jul. 26, 2018, which is English translation of "Written Opinion of the International Searching Authority", p. 1-p. 16.

"Office Action of China Counterpart Application", dated Jan. 21, 2020, with English translation thereof, p. 1-p. 15.

Office Action of Korea Counterpart Application, with English translation thereof, dated Jan. 14, 2020, pp. 1-13.

(Continued)

*Primary Examiner* — Monique R Peets

(74) *Attorney, Agent, or Firm* — JCIPRNET

(57) ABSTRACT

A near-infrared absorbing composition including a near-infrared absorbing dye [A], a resin-based dispersant [B1] having an amine value in the range from 20 to 200 (mg KOH/g), and a binder resin [C] having a weight average molecular weight in the range from 5,000 to 40,000 and an acid value of 130 mg KOH/g or less.

8 Claims, No Drawings

(56) References Cited

FOREIGN PATENT DOCUMENTS

| | | |
|---|---|---|
| JP | 2010090340 | 4/2010 |
| JP | 2011144257 | 7/2011 |
| JP | 2012247588 | 12/2012 |
| JP | 2013214000 | 10/2013 |
| JP | 2013241563 | 12/2013 |
| JP | 2014130343 | 7/2014 |
| JP | 2014153570 | 8/2014 |
| JP | 2014215474 | 11/2014 |
| JP | 2015091923 | 5/2015 |
| KR | 101559828 | 10/2015 |
| TW | 200940598 | 10/2009 |
| TW | 201135366 | 10/2011 |
| WO | 2016190162 | 12/2016 |

OTHER PUBLICATIONS

"Office Action of Taiwan Counterpart Application", dated Aug. 11, 2020, with English translation thereof, p. 1-p. 6.
"Office Action of China Counterpart Application," dated Aug. 14, 2020, with English translation thereof, p. 1-p. 14.

* cited by examiner

NEAR-INFRARED ABSORBING COMPOSITION FOR SOLID-STATE IMAGING DEVICE AND FILTER

CROSS-REFERENCE TO RELATED APPLICATIONS

This application is a Continuation Application of PCT Application No. PCT/JP2017/000858, filed Jan. 12, 2017, and is based upon and claims the benefit of priority from Japanese Patent Application No. 2016-006293, filed Jan. 15, 2016, the entire contents of all of which are incorporated herein by reference.

FIELD

The present specification relates to a near-infrared absorbing composition for a solid-state imaging device containing a specific near-infrared absorbing dye and a resin-based dispersant, a near-infrared absorbing filter for a solid-state imaging device including the near-infrared absorbing composition, and a solid-state imaging device.

BACKGROUND

A solid-state imaging device such as a CCD or a CMOS used for a digital still camera or the like has a spectral sensitivity ranging from a visible region to a near infrared region around 1200 nm. Therefore, since good color reproducibility cannot be obtained as it is, the visibility is corrected by using a near-infrared absorbing filter to which a specific substance that absorbs near-infrared is added.

Phthalocyanine-series materials, cyanine-series materials, and diimmonium-series materials are known as representative near-infrared absorbing dyes. As the phthalocyanine-series material, a phthalocyanine compound or a naphthalocyanine compound having a substituent (for example, see Jpn. Pat. Appln. KOKAI Publication No. H10-78509), a phthalocyanine compound having an amino group (for example, Jpn. Pat. Appln. KOKAI Publication No. 2004-18561, Jpn. Pat. Appln. KOKAI Publication No. 2001-106689, Jpn. Pat. Appln. KOKAI Publication No. 2000-63691, Jpn. Pat. Appln. KOKAI Publication No. 06-025548, and Jpn. Pat. Appln. KOKAI Publication No. 2000-026748), a phthalocyanine compound having an aryloxy group (see, for example, Jpn. Pat. Appln. KOKAI Publication No. 2013-241563), a fluorine-containing phthalocyanine compound (see, for example, Jpn. Pat. Appln. KOKAI Publication No. H05-078364 and Jpn. Pat. Appln. KOKAI Publication No. H06-107663) are known. However, since an absorption band specific to phthalocyanine exists in the visible light region (400 nm to 700 nm), the transparency of visible light is insufficient. Also, heat resistance and light resistance are not always satisfactory.

On the other hand, cyanine-series materials and diimmonium-series materials have excellent near-infrared absorptivity and extremely excellent visible light transparency. A variety of such materials are known (for example, Jpn. Pat. Appln. KOKAI Publication No. 2007-219114, Jpn. Pat. Appln. KOKAI Publication No. 2010-072575, Jpn. Pat. Appln. KOKAI Publication No. H05-247437, Jpn. Pat. Appln. KOKAI Publication No. 2005-325292, and Jpn. Pat. Appln. KOKAI Publication No. 2003-096040). In addition, these dyes also have high solubility and resin compatibility. However, the stability as a dye is considerably low, and the heat resistance and light resistance are not satisfactory.

SUMMARY

The problem to be solved by the present invention is to provide a near-infrared absorbing composition for a solid-state imaging device, which is low in absorption in the visible region (400 nm to 700 nm), excellent in near-infrared absorptivity and highly durable, and capable of forming a fine pattern smaller than 10 µm when used in a near-infrared absorbing filter for a solid-state imaging device, a near-infrared absorbing filter for a solid-state imaging device formed of the near-infrared absorbing composition, and a solid-state imaging device including the near-infrared absorbing filter.

The inventors of the present invention conducted intensive studies in order to solve the various problems mentioned above, and as a result, achieved the present invention.

The present specification relates to a near-infrared absorbing composition for a solid-state imaging device, which includes a near-infrared absorbing dye [A] represented by the following General formula (1), a resin-based dispersant [B1] having an amine value in the range from 20 to 200 (mg KOH/g), and a binder resin [C] having a weight average molecular weight in the range from 5,000 to 40,000 and an acid value of 130 mg KOH/g or less.

[General formula (1)]

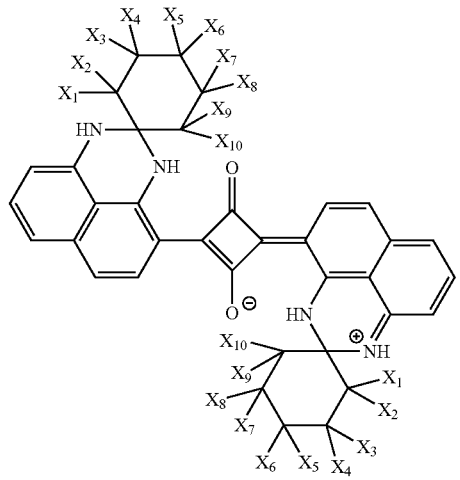

In General formula (1), $X_1$ to $X_{10}$ each independently represent a hydrogen atom, an alkyl group which may have a substituent, an alkenyl group which may have a substituent, an aryl group which may have a substituent, an aralkyl group which may have a substituent, an alkoxy group which may have a substituent, an aryloxy group which may have a substituent, an amino group, a substituted amino group, a sulfo group, $-SO_2NR_1R_2$, $-COOR_1$, $-CONR_1R_2$, a nitro group, a cyano group, or a halogen atom. $R_1$ and $R_2$ each independently represent a hydrogen atom or an alkyl group which may have a substituent. $X_1$ to $X_{10}$ may be bonded to each other to form a ring.

The present specification also relates to the near-infrared absorbing composition for a solid-state imaging device, which further includes a photopolymerizable monomer [D] and a photopolymerization initiator [E].

The present specification also relates to the near-infrared absorbing composition for a solid-state imaging device in which the photopolymerization initiator [E] contains at least one selected from the group consisting of an oxime ester-series photopolymerization initiator [E1] and an aminoketone-series photopolymerization initiator [E2].

Further, the present specification relates to the near-infrared absorbing composition for a solid-state imaging device in which the photopolymerizable monomer [D] contains a photopolymerizable monomer [D1] including 3 to 12 ethylenic unsaturated double bond groups in one molecule.

The present specification further relates to the near-infrared absorbing composition for solid-state imaging device, which further includes an epoxy resin [F].

The present specification further relates to the near-infrared absorbing composition for a solid-state imaging device, which further includes a hindered phenol series antioxidant.

Furthermore, the present specification relates to the near-infrared absorbing composition for a solid-state imaging device, in which the binder resin [C] is a copolymer of monomers containing (meth)acrylic acid and hydroxyethyl methacrylate and has an acid value in the range from 100 to 130 mg KOH/g.

The present specification also relates to the near-infrared absorbing composition for a solid-state imaging device, in which the resin-based dispersant [B1] includes a tertiary amino group and a quaternary ammonium salt group.

The present specification also relates to a near-infrared absorbing filter including the aforementioned near-infrared absorbing composition for the solid-state imaging device.

Furthermore, the present specification relates to a solid-state imaging device including the near-infrared absorbing filter on a substrate.

According to the present specification, it is possible to provide a near-infrared absorbing composition excellent in transmittance in the visible range (400 nm to 700 nm), near-infrared absorptivity, storage stability, durability such as heat resistance and light resistance, and patterning property capable of forming a pattern smaller than 10 μm, a near-infrared absorbing filter for a solid-state imaging device formed of the near-infrared absorbing composition, and a solid-state imaging device including the near-infrared absorbing filter.

DETAILED DESCRIPTION

Hereinafter, the present disclosure will be described in detail.

<Near-Infrared Absorbing Dye [A]>

The near-infrared absorbing dye [A] represented by the General formula (1) of the present specification will be described in detail.

[General formula (1)]

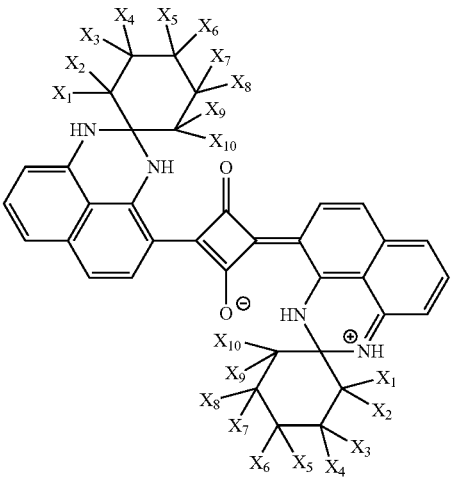

In General formula (1), $X_1$ to $X_{10}$ each independently represent a hydrogen atom, an alkyl group which may have a substituent, an alkenyl group which may have a substituent, an aryl group which may have a substituent, an aralkyl group which may have a substituent, an alkoxy group which may have a substituent, an aryloxy group which may have a substituent, an amino group, a substituted amino group, a sulfo group, —$SO_2NR_1R_2$, —$COOR_1$, —$CONR_1R_2$, a nitro group, a cyano group, or a halogen atom. $R_1$ and $R_2$ each independently represent a hydrogen atom or an alkyl group which may have a substituent. $X_1$ to $X_{10}$ may be bonded to each other to form a ring.

Examples of the "alkyl group which may have a substituent" in $X_1$ to $X_{10}$ include a methyl group, an ethyl group, an n-propyl group, an isopropyl group, a pert-butyl group, a tert-amyl group, a 2-ethylhexyl group, a stearyl group, a chloromethyl group, a trichloromethyl group, a trifluoromethyl group, a 2-methoxyethyl group, a 2-chloroethyl group, a 2-nitroethyl group, a cyclopentyl group, a cyclohexyl group, a dimethylcyclohexyl group, and the like. Among them, a methyl group, an ethyl group and an n-propyl group are preferable from the viewpoint of imparting durability and ease of synthesis, and a methyl group is particularly preferable.

Examples of the "alkenyl group which may have a substituent" in $X_1$ to $X_{10}$ include a vinyl group, a 1-propenyl group, an allyl group, a 2-butenyl group, a 3-butenyl group, an isopropenyl group, an isobutenyl group, a 1-pentenyl group, a 2-pentenyl group, a 3-pentenyl group, a 4-pentenyl group, a 1-hexenyl group, a 2-hexenyl group, a 3-hexenyl group, a 4-hexenyl group, and a 5-hexenyl group, and the like. Among them, a vinyl group and an allyl group are preferable from the viewpoint of imparting durability and ease of synthesis.

Examples of the "aryl group which may have a substituent" in $X_1$ to $X_{10}$ include a phenyl group, a naphthyl group, a 4-methylphenyl group, a 3,5-dimethylphenyl group, a pentafluorophenyl group, a 4-bromophenyl group, a 2-methoxyphenyl group, a 4-diethylaminophenyl group, a 3-nitrophenyl group, a 4-cyanophenyl group, and the like. Among them, a phenyl group and a 4-methylphenyl group are preferable from the viewpoint of imparting durability and ease of synthesis.

Examples of the "aralkyl group which may have a substituent" in $X_1$ to $X_{10}$ include a benzyl group, a phenethyl group, a phenylpropyl group, a naphthylmethyl group, and the like. Among them, a benzyl group is preferable from the viewpoint of imparting durability and ease of synthesis.

Examples of the "alkoxy group which may have a substituent" in $X_1$ to $X_{10}$ include a methoxy group, an ethoxy group, an n-propoxy group, an isopropoxy group, an n-butoxy group, an n-octyloxy group, a 2-ethylhexyloxy group, a trifluoromethoxy group, a cyclohexyloxy group, a stearyloxy group, and the like. Among them, a methoxy group, an ethoxy group and a trifluoromethoxy group are preferable from the viewpoint of imparting durability and ease of synthesis.

Examples of the "aryloxy group which may have a substituent" in $X_1$ to $X_{10}$ include a phenoxy group, a naphthyloxy group, a 4-methylphenyloxy group, a 3,5-chlorophenyloxy group, a 4-chloro-2-methylphenyloxy group, a 4-tert-butylphenyloxy group, a 4-methoxyphenyloxy group, a 4-diethylaminophenyloxy group, a 4-nitrophenyloxy group, and the like. Among them, a phenoxy group and a naphthyloxy group are preferable from the viewpoint of imparting durability and ease of synthesis.

Examples of the "substituted amino group" in $X_1$ to $X_{10}$ include a methylamino group, an ethylamino group, an isopropylamino group, a n-butylamino group, a cyclohexylamino group, a stearylamino group, a dimethylamino group, a diethylamino group, a dibutylamino group, an N,N-di(2-hydroxyethyl)amino group, a phenylamino group, a naphthylamino group, 4-tert-butylphenylamino group, a diphenylamino group, an N-phenyl-N-ethylamino group, and the like. Among them, a dimethylamino group and a diethylamino group are preferable from the viewpoint of imparting durability and ease of synthesis.

In $X_1$ to $X_{10}$, examples of the "halogen atom" include fluorine, bromine, chlorine and iodine.

$X_1$ to $X_{10}$ may combine with each other to form a ring, and examples thereof include, but are not limited to, the following structures.

[Chemical formulae (3-1) to (3-6)]

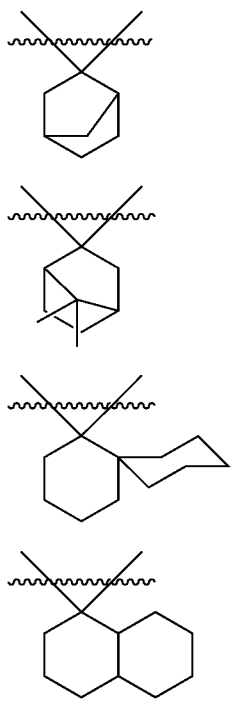

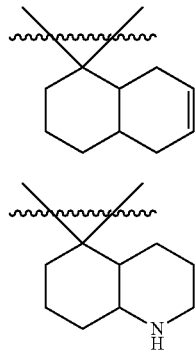

The "alkyl group which may have a substituent" in $R_1$ and $R_2$ has the same meaning as discussed before with reference to $X_1$ to $X_{10}$.

$X_1$ to $X_{10}$ preferably contain an unsubstituted alkyl group, more preferably at least one of $X_3$, $X_4$, $X_7$ and $X_8$ is an unsubstituted alkyl group, and particularly preferably, $X_3$ and $X_7$ are each an unsubstituted alkyl group. The unsubstituted alkyl group is preferably a methyl group.

The near-infrared absorbing composition of the present specification includes a near-infrared absorbing dye [A] represented by the General formula (1), a resin-based dispersant [B1], and a binder resin [C]. In some embodiments, the near-infrared absorbing composition optionally further includes a photopolymerizable monomer [D], a photopolymerization initiator [E], an organic solvent, a sensitizer, other auxiliary components, and the like.

In the near-infrared absorbing composition of the present specification, the near-infrared absorbing dye [A] can be used alone or as a mixture of two or more kinds at an arbitrary ratio as required.

The content of the near-infrared absorbing dye [A] in the near-infrared absorbing composition of the present specification can be adjusted as necessary, but it is preferably contained in an amount in the range from 0.01 to 50% by mass, more preferably from 0.1 to 30% by mass, where the percentage by mass is evaluated as the ratio between the solid content of the near-infrared absorbing dye [A] and the total mass of the composition excluding the solvent. When the content of near-infrared absorbing dye [A] falls within these ranges, good absorptivity in the near-infrared region of the light spectrum and good transparency in the visible region of the light spectrum can be achieved.

In the near-infrared absorbing composition of the present specification, it is preferable that the near-infrared absorbing dye [A] be dispersed with a resin-based dispersant [B1] and used in a state of fine particle dispersion. Use in the state of fine particle dispersion is advantageous in that the durability of the compound is improved. The near-infrared absorbing dye [A] used in the present specification preferably has an average primary particle size from 1 to 500 nm at the time of dispersion, more preferably from 10 to 200 nm, particularly preferably from 10 to 100 nm. It is preferable that the average primary particle size of the fine particles be 1 nm or more, because in that case, the surface energy of the particles becomes small, so that agglomeration is less likely to occur, and fine particle dispersion is facilitated and the dispersion state is easily kept stable. It is also preferable that the average primary particle size of the fine particles be 200 nm or less, because the influence of particle scattering is reduced and the absorption spectrum is sharpened.

The average primary particle diameter of the near-infrared absorbing dye [A] was measured by a method of directly measuring the size of primary particles from an electron micrograph using a transmission electron microscope (TEM). Specifically, the short axis diameter and the major axis diameter of the dye primary particles were measured, and the average was taken as the primary particle diameter of the dye. Next, with respect to 100 or more dye particles, the volume (weight) of each particle was approximated to the cube of the obtained particle diameter, and the volume average particle diameter was regarded as the average primary particle diameter.

(Method for Producing the Near-Infrared Absorbing Dye [A])

As a method for producing the near-infrared absorbing dye [A], 1,8-diaminonaphthalene (having a structure represented by Chemical formula (4)) and cyclohexanones represented by the following General formula (2) may be heated and refluxed in a solvent together with a catalyst to be condensed, and then further heated and refluxed with 3,4-dihydroxy-3-cyclobutene-1,2-dione represented by the following General formula (3) to be condensed, thereby producing the near-infrared absorbing dye [A] represented by the General formula (1). The near-infrared absorbing dye [A] used in the present specification is not restricted by these production methods.

[Chemical Formula (4) and General formulae (1) to (3)]

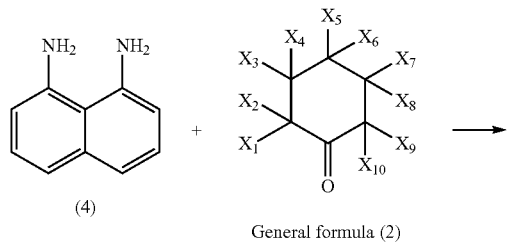

(4)

General formula (2)

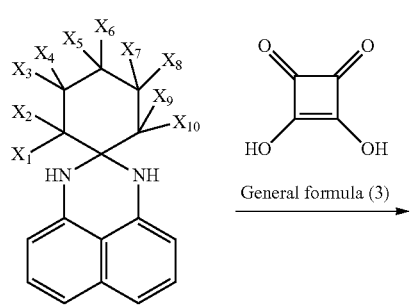

General formula (3)

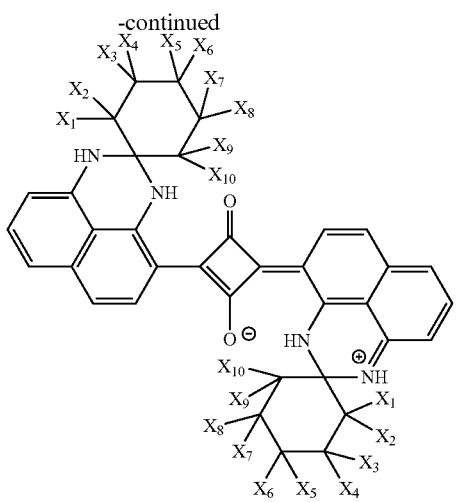

General formula (1)

<Resin-Based Dispersant [B1]>

The near-infrared absorbing composition of the present specification contains a resin-based dispersant [B1] having an amine value from 20 to 200 (mg KOH/g). The amine value of the resin-based dispersant [B1] is preferably 60 to 150 (mg KOH/g), more preferably 60 to 120 (mg KOH/g). The resin-based dispersant [B1] of the present specification includes a pigment affinity segment having a property of adsorbing to a dye and a segment capable of acting as a dye carrier. The pigment affinity segment is adsorbed to the near-infrared absorbing dye (A) and functions to stabilize dispersion in the dye carrier. In particular, a structure-controlled resin such as a graft type (comb-shaped) or a block type is preferably used. Specific examples of the main chain and/or the side chain skeleton of the resin-based dispersant [B1] include: polycarboxylic acid esters such as polyurethane and polyacrylate; an unsaturated polyamide, a polycarboxylic acid, a polycarboxylic acid (partial) amine salt, a polycarboxylic acid ammonium salt, a polycarboxylic acid alkylamine salt, a polysiloxane, a long chain polyamino amide phosphate, a hydroxyl group-containing polycarboxylic acid ester, and a modified product thereof; an oily dispersant such as an amide formed by reaction of a poly (lower alkylene imine) and a polyester having a free carboxyl group and a salt thereof; a water-soluble resin or water-soluble polymer compound, such as a (meth)acrylic acid-styrene copolymer, a (meth)acrylic acid-(meth)acrylic acid ester copolymer, a styrene-maleic acid copolymer, a polyvinyl alcohol and a polyvinyl pyrrolidone; a polyester series; a modified polyacrylate series; an ethylene oxide/propylene oxide adduct; a phosphoric ester series and the like. One of these materials may be used alone or two or more may be used as a mixture. Among them, those including a (meth)acrylic copolymer as a main chain and/or a side chain are preferable. Specific examples of the dye adsorbing group of the resin-based dispersant [B1] include: an acid type adsorbing group, such as an aromatic carboxylic acid group and a phosphoric acid group; and a basic type adsorbing group, such as a primary amino group, a secondary amino group, a tertiary amino group, and a quaternary ammonium salt. Among them, a resin-based dispersant [B1] including an aromatic carboxylic acid group, a tertiary amino group or a quaternary ammonium salt as a dye adsorbing group is preferable from the viewpoints of near-infrared absorptivity and durability, and a resin-based dispersant [B1] including a tertiary amino group or a quaternary ammonium salt as a dye adsorbing group is particularly preferable. When the resin-based dispersant [B1] contains both a tertiary amino group and a quaternary ammonium salt group, it is preferable from the viewpoints of not only the transmittance in the visible range, the near-infrared absorptivity, the durability and the patterning property but also the storage stability.

Examples of the commercially available resin-based dispersant [B1] are Disperbyk-106, 108, 109, 112, 116, 130, 140, 142, 145, 166, 180, 187, 2001, 2010, 2020, 2025, 2050, 2070, 6919, etc. produced by BYK Japan K.K., SOLSPERSE-13240, 13650, 13940, 20000, 24000, 26000, 32000, 33000, 39000, 56000, 71000, etc. produced by Lubrizol Japan Limited., and Ajisper PB 711 etc. produced by Ajinomoto Fine-Techno Co., Inc. Also, the resin-based dispersant [B1] can be produced by a known method such as the method described in Jpn. PCT National Publication No. 2010-506016. However, if the resin-based dispersant [B1] is a block copolymer, it can be produced by, for example, copolymerizing a monomer including a tertiary amino group or a quaternary amino group with another monomer. If the resin-based dispersant [B1] is a graft copolymer, it can be produced by grafting a monomer including a tertiary amino group or a quaternary amino group as a reactive group on the side chain of the main chain polymer.

The resin-based dispersant [B1] can include a single kind of dispersant, or a mixture of two or more kinds at an arbitrary ratio as required. The resin-based dispersant [B1] is preferably 5 to 200% by weight, based on the total amount (100% by weight) of the near-infrared absorbing dye [A] in the near-infrared absorbing composition, and more preferably 10 to 150% by weight from the viewpoint of optical characteristics and durability.

<Other Resin-Based Dispersant>

The near-infrared absorbing composition of the present specification may include another resin-based dispersant that is different from the resin-based dispersant [B1] having an amine value of 20 to 200 (mg KOH/g). The other resin-based dispersant includes a pigment affinity segment having a property of adsorbing to a dye and a segment capable of acting as a dye carrier. The pigment affinity segment is adsorbed to the near-infrared absorbing dye (A) and functions to stabilize dispersion in the dye carrier. In particular, a structure-controlled resin such as a graft type (comb-shaped) or a block type is preferably used.

As commercially available other resin-based dispersant Disperbyk-101, 103, 110, 111, 154, 161, 162, 163, 164, 165, 167, 168, 170, 171, 174, 181, 182, 183, 184, 185, 190, 2000, 2009, 2095, 2150, 2155, 2163, 2164 or Anti-Terra-U, 203, 204, or BYK-P104, P104S, 220S, or Lactimon, Lactimon-WS, or Bykumen, etc. produced by BYK Japan K.K., SOLSPERSE-3000, 5000, 11200, 12000, 9000, 13000, 16000, 17000, 18000, 21000, 27000, 28000, 31845, 32500, 32550, 33500, 32600, 34750, 35100, 36600, 38500, 41000, 41090, 53095, 55000, 76500, etc. produced by Lubrizol Japan Limited., and AJISPER PA111, PB821, PB822, PB824, etc. produced by Ajinomoto Fine-Techno Co., Inc., may be used, but the disclosure is not limited thereto.

<Binder Resin [C]>

The binder resin [C] of the present specification has an acid value of 130 mg KOH/g or less, a weight average molecular weight (Mw) in the range from 5,000 to 40,000, and a spectral transmittance of preferably 80% or more, more preferably 95% or more, in a whole wavelength region from 400 nm to 700 nm of the visible light region. As binder resin [C], use of an acrylic copolymer of monomers containing methacrylic acid and hydroxyethyl methacrylate is preferable, because storage stability of the near-infrared absorbing composition is improved by the use. As binder resin [C], a resin having an acid value in the range from 100 mg KOH/g to 120 mg KOH/g, and a weight average molecular weight in the range from 8,000 to 15,000 is particularly preferable. When an alkali developing resist material is used as binder resin [C], it is preferable to use an alkali-soluble vinyl resin obtained by copolymerizing acidic group-containing ethylenic unsaturated monomers. An active energy ray-curable resin having an ethylenic unsaturated double bond can also be used for the purpose of further improving the photosensitivity and improving the solvent resistance.

Particularly, by using an active energy ray-curable resin having an ethylenic unsaturated double bond in the side chain for an alkali developing resist, coating film foreign matter is not generated after application of the near-infrared absorbing composition of the present specification. Thus, the stability of the near-infrared absorbing dye [A] in the resist material is improved. In the case of using a linear resin having no ethylenic unsaturated double bond in the side chain as binder resin [C], the near-infrared absorbing dye [A] has a degree of freedom and is not liable to be trapped in the resin in a mixed solution of the binder resin [C] and the near-infrared absorbing dye [A]. Therefore, the dye components tend to aggregate and precipitate. However, by using an active energy ray-curable resin having an ethylenic unsaturated double bond in the side chain as the binder resin [C], the near-infrared absorbing dye [A] is easily trapped in the resin in a mixed solution of the resin and the dye, so that in a solvent resistance test, the near-infrared absorbing dye [A] is not liable to be eluted and the dye components do not tend to aggregate and precipitate. Furthermore, when the binder resin [C] is exposed to an active energy ray to form a film, the binder resin [C] is three-dimensionally cross-linked, thereby fixing the molecules of the near-infrared absorbing dye [A]. Therefore, even if the solvent is removed in the subsequent developing step, it is presumed that the near-infrared absorbing dye [A] is not liable to aggregate and precipitate.

When the binder resin [C] is used in a near-infrared absorbing composition for a solid-state imaging device, from the viewpoints of permeability, developability, and heat resistance of the near-infrared absorbing dye [A] of the present specification, the balance between an aliphatic carboxyl group serving as an alkali-soluble group during developing and an aliphatic group and an aromatic group serving as an affinity group for a dye carrier and a solvent is important, and the acid value of the binder resin [C] is preferably 130 mg KOH/g or less.

The number-average molecular weight (Mn) of the binder resin [C] is preferably in the range from 5,000 to 25,000, and the value of Mw/Mn is preferably 10 or less.

The case where the acid value of binder resin [C] exceeds 130 mg KOH/g or when the weight average molecular weight (Mw) of the binder resin [C] is 5,000 or less is not preferable, because the binder resin [C] is eroded and tends to be peeled by an alkaline developing solution or a chemical solution for peeling off a positive resist to be used for forming a fine pattern of less than 10 μm by photolithography or etching.

The binder resin [C] is preferably used in an amount of 30 parts by weight or more with respect to 100 parts by weight of the total weight of the near-infrared absorbing dye [A], from the viewpoint of satisfactory film forming property and various resistance characteristics, and preferably used in an amount not more than 500 parts by weight from the viewpoint of high concentration of the near-infrared absorbing dye [A] and satisfactory optical properties.

<Photopolymerizable Monomer [D]>

The photopolymerizable monomer [D] that can be used in the present specification includes a monomer or oligomer which is cured by ultraviolet or heat to form a transparent resin. One of these materials may be used alone or a mixture of two or more may be used. A photopolymerizable monomer [D1] having 3 to 12 unsaturated bonding groups in one molecule may be preferably used as photopolymerizable monomer [D].

Examples of the photopolymerizable monomer [D] include phenoxytetraethylene glycol(meth)acrylate, phenoxyhexaethylene glycol(meth)acrylate, EO modified phthalic acid(meth)acrylate, PO modified phthalic acid (meth)acrylate, acrylated isocyanurate, bis(acryloxyneopentylglycol) adipate, polyethylene glycol 200 di(meth)acrylate, polyethylene glycol 400 di(meth)acrylate, tetraethylene glycol di(meth)acrylate, EO modified trimethylolpropane triacrylate, PO modified trimethylolpropane tri(meth)acrylate, tripropylene glycol di(meth)acrylate, tris(acryloxyethyl) isocyanurate, caprolactone modified tris(acryloxyethyl) isocyanurate, neopentylglycol hydroxypivalate di(meth)acylylate, pentaerythritol tri(meth)acrylate, dicyclopentanyl di(meth)acrylate, EO modified bisphenol A di(meth)acrylate, dipentaerythritol hexa(meth)acrylate, dipentaerythritol monohydroxypenta(meth)acrylate, alkyl modified dipentaerythritol penta(meth)acrylate, caprolactone modified dipentaerythritol hexa(meth)acrylate, and the like.

Examples of commercially available products of these compounds include KAYARAD DPHA, KAYARAD DPEA-12, KAYARAD DPHA-2C, KAYARAD D-310, KAYARAD D-330, KAYARAD DPCA-20, KAYARAD DPCA-30, KAYARAD DPCA-60, KAYARAD DPCA-120, KAYARAD R526, KAYARAD PEG400DA, KAYARAD R-167, KAYARAD HX-220, KAYARAD R-551, KAYARAD R712, KAYARAD R-604, KAYARAD R-684, KAYARAD GPO-303, and KAYARAD TMPTA produced by Nippon Kayaku Co., Ltd., M210, M220, M225, M305, M309, M325, M350, and M-402 produced by Toagosei Co., Ltd., Viscoat 195, Viscoat 230, Viscoat 260, Viscoat 215, Viscoat 310, Viscoat 214 HP, Viscoat 295, Viscoat 300, Viscoat 360, Viscoat GPT, Viscoat 400, Viscoat 700, Viscoat 540, Viscoat 3000, Viscoat 3700, produced by Osaka Organic Company, and the like.

The amount of the photopolymerizable monomer [D] in the near-infrared absorbing composition is preferably in the range from 5 to 400 parts by weight, more preferably 10 to 300 parts by weight with respect to 100 parts by weight of the near-infrared absorbing dye [A], from the viewpoint of photocurability and developability.

Examples of the monomer or oligomer which is cured by ultraviolet light or heat to form a transparent resin include, but are not necessarily limited to, methyl(meth)acrylate, ethyl(meth)acrylate, 2-hydroxyethyl(meth)acrylate, 2-hydroxypropyl(meth)acrylate, cyclohexyl(meth)acrylate, β-carboxyethyl(meth)acrylate, polyethylene glycol di(meth) acrylate, 1,6-hexanediol di(meth)acrylate, triethylene glycol di(meth)acrylate, tripropylene glycol di(meth)acrylate, trimethylolpropane tri(meth)acrylate, pentaerythritol tri(meth) acrylate, pentaerythritol tetra(meth)acrylate, 1,6-hexanediol diglycidylether di(meth)acrylate, bisphenol A diglycidylether di(meth)acrylate, neopentyl glycol diglycidylether di(meth)acrylate, dipentaerythritol hexa(meth)acrylate, dipentaerythritol penta(meth)acrylate, tricyclodecanyl (meth)acrylate, ester acrylate, (meth)acrylate of methylolated melamine, various acrylic acid esters and methacrylic acid esters such as epoxy(meth)acrylate and urethane acrylate, (meth)acrylic acid, styrene, vinyl acetate, hydroxyethyl vinyl ether, ethylene glycol divinyl ether, pentaerythritol trivinyl ether, (meth)acrylamide, N-hydroxymethyl(meth) acrylamide, N-vinylformamide, acrylonitrile, and the like.

<Photopolymerization Initiator [E]>

In the case where the near-infrared absorbing composition of the present specification is cured by irradiation with ultraviolet light and a filter segment is formed by a photolithographic method, a photopolymerization initiator [E] or the like is added to the composition, so that the composition can be adjusted in the form of a solvent development type or alkali development type color resist material.

Among them, it is preferable to use at least one selected from the group consisting of an oxime ester-series photopolymerization initiator [E1] and an aminoketone-series photopolymerization initiator [E2] from the viewpoint of favorable photosensitivity and resolution.

(Oxime Ester-Series Photopolymerization Initiator [E1])

Examples of the oxime ester-series photopolymerization initiator [E1] include acetophenone, benzophenone, 4,4'-bis (diethylamino)-benzophenone, 4-(methylphenylthio)-phenyl phenyl ketone, benzyldimethyl ketal, 2-methyl-1-methylthiophenyl-2-morpholinopropane-1-one, 2-benzyl-2-dimethylamino-1-(4-morpholinophenyl) butane-1-one, p-diethylaminobenzoate ethyl, thioxanthone, 2,5-diethylthioxanthone, 2-chloroxanthone, isopropylthioxanthone, 1-chloro-4-propoxy-thioxanthone, 2-(o-chlorophenyl)-4,5-diphenylimidazole dimer, 2-(o-fluorophenyl)-4,5-diphenyl imidazole dimer, 2-(o-methoxyphenyl)-4,5-diphenyl imidazole dimer, 2-(p-methoxyphenyl)-4,5-diphenyl imidazole dimer, 2-(o-chlorophenyl)-4,5-di(o-methoxyphenyl) imidazole dimer, 9-phenylacridine, 9-(p-toluyl) acridine, 1,7-bis (9,9'-acridinyl)heptane, N-phenylglycine, bis(η5-cyclopentadienyl)bis[2,6-difluoro-3-(1H-pyrrol-1-yl) phenyl] titanium, 2-ethylanthraquinone, 1-chloroanthraquinone, 2-phenyl-4,6-bis (trichloromethyl)-s-triazine, 2-(4-methoxyphenyl)-4,6-bis (trichloromethyl)-s-triazine, 2-naphthyl-4,6-bis (trichloromethyl)-s-triazine, 2-(4-methoxynaphthyl)-4,6-bis(trichloromethyl)-s-triazine, 2-methyl-4,6-bis(trichloromethyl)-s-triazine, and the like.

(Aminoketone-Series Photopolymerization Initiator [E2])

Aminoketone series photopolymerization initiator [E2] includes, for example, the following compounds. 2-dimethylamino-2-methyl-1-phenylpropane-1-one, 2-diethylamino-2-methyl-1-phenylpropane-1-one, 2-methyl-2-morpholino-1-phenylpropane-1-one, 2-dimethylamino-2-methyl-1-(4-methylphenyl) propane-1-one, 2-dimethylamino-1-(4-ethylphenyl)-2-methylpropane-1-one, 2-dimethylamino-1-(4-isopropylphenyl)-2-methylpropane-1-one, 1-(4-butylphenyl)-2-dimethylamino-2-methylpropane-1-one, 2-dimethylamino-1-(4-methoxyphenyl)-2-methylpropane-1-one, 2-dimethylamino-2-methyl-1-(4-methylthiophenyl) propane-1-one, 2-methyl-1-(4-methylthiophenyl)-2-morpholinopropane-1-one (IRGACURE 907), 2-benzyl-2-dimethylamino-1-(4-morpholinophenyl)-butane-1-one (IRGACURE 369), 2-benzyl-2-dimethylamino-1-(4-dimethylaminophenyl)-butane-1-one, 2-dimethylamino-2-[(4-methylphenyl) methyl]-1-[4-(4-morpholinyl) phenyl]-1-butanone (IRGACURE 379), and the like.

The near-infrared absorbing composition of the present specification may contain other photopolymerization initiators together with the oxime ester-series photopolymerization initiator [E1] and the aminoketone-series photopolymerization initiator [E2]. The other photopolymerization initiators include: triazine-series compounds such as 2,4,6-trichloro-s-triazine, 2-phenyl-4,6-bis (trichloromethyl)-s-triazine, 2-(p-methoxyphenyl)-4,6 bis (trichloromethyl)-s-triazine, 2-(p-tolyl)-4,6-bis (trichloromethyl)-s-triazine, 2-piperonyl-4,6-bis (trichloromethyl)-s-triazine, 2,4-bis (trichloromethyl)-6-styryl-s-triazine, 2-(naphto-1-yl)-4,6-bis (trichloromethyl)-s-triazine, 2-(4-methoxy-naphto-1-yl-4,6-bis (trichloromethyl)-s-triazine, 2,4-trichloromethyl-(piperonyl)-6-triazine or 2,4-trichloromethyl (4'-methoxystyryl)-6-triazine; phosphine-series compounds such as bis (2,4,6-trimethylbenzoyl) phenylphosphine oxide or 2,4,6-trimethylbenzoyl diphenylphosphine oxide; quinone-series compounds such as 9,10-phenanthrenequinone, camphorquinone and ethylanthraquinone; borate-series compounds; carbazole-series compounds; imidazole-series compounds; and titanocene-series compounds.

The amount of the photopolymerization initiator [E] in the near-infrared absorbing composition is preferably in the range from 5 to 200 parts by weight with respect to 100 parts by weight of the total amount of the near-infrared absorbing dye [A], and more preferably from 10 to 150 parts by weight from the viewpoint of photocurability and developability.

One of these photopolymerization initiators may be used alone or a mixture of two or more may be used at an arbitrary ratio as required. The photopolymerization initiator [E] is preferably in the range from 5 to 200% by weight, based on the total amount (100% by weight) of the near-infrared absorbing dye [A] in the near-infrared absorbing composition, and more preferably from 10 to 150% by weight from the viewpoint of photocurability and developability.

(Thermoplastic Resin)

Examples of the thermoplastic resin used for the binder resin [C] include an acrylic resin, a butyral resin, a styrene-maleic acid copolymer, chlorinated polyethylene, chlorinated polypropylene, polyvinyl chloride, a vinyl chloride-vinyl acetate copolymer, a polyvinyl acetate, a polyurethane resin, a polyester resin, a vinyl-series resin, a alkyd resin, a polystyrene resin, a polyamide resin, a rubber-series resin, a cyclized rubber-series resin, celluloses, polyethylene (HDPE, LDPE), a polybutadiene, polyimide resin, and the like. Among them, it is preferable to use acrylic resin.

Examples of the alkali-soluble vinyl-series resin copolymerized with the acidic group-containing ethylenic unsaturated monomer include resins having acidic groups such as aliphatic carboxyl group and sulfonic group. Specific examples of the alkali-soluble resin include an acrylic resin including acidic group, α-olefin/(anhydride) maleic acid copolymer, styrene/styrene sulfonic acid copolymer, ethylene/(meth) acrylic acid copolymer, or isobutylene/(anhydride) maleic acid copolymer, and the like. Among them, at least one resin selected from an acrylic resin including acidic group, and styrene/styrene sulfonic acid copolymer, particularly an acrylic resin including acidic group, is preferably used because of its high heat resistance and transparency.

As the active energy ray-curable resin including an ethylenic unsaturated double bond, for example, a resin including an unsaturated ethylenic double bond introduced by the following method (a) or (b) can be used.

[Method (a)]

As the method (a), for example, the side chain epoxy group of a copolymer obtained by copolymerizing an unsaturated ethylenic monomer including epoxy group and one or more other monomers is reacted by addition reaction with carboxyl group of an unsaturated monobasic acid including an unsaturated ethylenic double bond. The generated hydroxyl group is further reacted with a polybasic acid anhydride, so that an unsaturated ethylenic double bond and carboxyl group are introduced.

Examples of the unsaturated ethylenic monomer including an epoxy group include glycidyl (meth)acrylate, methylglycidyl (meth)acrylate, 2-glycidoxyethyl (meth)acrylate, 3,4 epoxybutyl (meth)acrylate, and 3,4 epoxycyclohexyl (meth)acrylate. These may be used alone, or two or more of them may be used in combination. Glycidyl (meth)acrylate is preferable from the viewpoint of reactivity with the unsaturated monobasic acid in the next step.

Examples of the unsaturated monobasic acid include monocarboxylic acids, such as a (meth)acrylic acid, a crotonic acid, α-position haloalkyl, alkoxyl, halogen, nitro, or cyano substitution of a (meth)acrylic acid, and the like. These may be used alone, or two or more of them may be used in combination.

Examples of the polybasic acid anhydride include succinic anhydride and maleic anhydride, which may be used alone, or two or more of them may be used in combination.

As a method similar to the method (a), for example, a part of the side chain aliphatic carboxyl group of a copolymer obtained by copolymerizing an unsaturated ethylenic monomer including an aliphatic carboxyl group with one or more other monomers is reacted by addition reaction with an unsaturated ethylenic monomer including an epoxy group, so that an unsaturated ethylenic double bond and a carboxyl group are introduced.

[Method (b)]

As the method (b), for example, an isocyanate group of an unsaturated ethylenic monomer including an isocyanate group is reacted with a side chain hydroxyl group of a copolymer obtained by copolymerizing a monomer of an unsaturated monobasic acid including another aliphatic carboxyl group and another monomer by using an unsaturated ethylenic monomer including a hydroxyl group.

Examples of the unsaturated ethylenic monomer including a hydroxyl group include hydroxyalkyl (meth) acrylates, such as 2-hydroxyethyl (meth)acrylate, 2- or 3-hydroxypropyl (meth)acrylate, 2- or 3- or 4-hydroxybutyl (meth)acrylate, glycerol (meth)acrylate, or cyclohexanedimethanol mono (meth)acrylate, and the like. These may be used alone, or two or more of them may be used in combination. Also, polyether mono (meth)acrylate obtained by adding ethylene oxide, propylene oxide, and/or butylene oxide, etc. to the above hydroxyalkyl (meth)acrylate by addition polymerization, or (poly) ester mono (meth)acrylate obtained by adding (poly) γ-valerolactone, (poly) ε-caprolactone, and/or (poly) 12-hydroxystearic hydroxystearic acid, etc. to the above hydroxyalkyl (meth)acrylate can be used. From the viewpoint of suppression of coating foreign matter, 2-hydroxyethyl (meth)acrylate or glycerol (meth)acrylate is preferable.

The unsaturated ethylenic monomer including an isocyanate group may be, but is not limited to, 2-(meth)acryloyloxyethyl isocyanate or 1,1-bis[(meth)acryloyloxy] ethyl isocyanate. Two or more of these may be used in combination.

(Thermosetting Resin)

Examples of the thermosetting resin used for the binder resin [C] include an epoxy resin, a benzoguanamine resin, a rosin-modified maleic acid resin, a rosin-modified fumaric acid resin, a melamine resin, a urea resin, a cardo resin, a phenol resin, and the like.

The thermosetting resin may be, but is not limited to, a low molecular weight compound, such as an epoxy compound, a benzoguanamine compound, a rosin-modified maleic acid compound, a rosin-modified fumaric acid compound, a melamine compound, a urea compound, a cardo compound, a phenol compound. Inclusion of such a thermosetting resin is advantageous in that the resin reacts at the time of baking a filter segment to increase the crosslinking density of the coating film, improve the heat resistance, and suppress the aggregation of the pigment at the time of baking the filter segment. Among them, epoxy resin [F], cardo resin, or melamine resin is preferable, and epoxy resin [F] is particularly preferable.

[Epoxy Resin [F]]

Examples of the epoxy resin [F] include a bisphenol A series epoxy compound/or resin, a hydrogenated bisphenol A series epoxy compound/or resin, a bisphenol F series epoxy compound/or resin, a hydrogenated bisphenol F series epoxy compound/or resin, a novolak type epoxy compound/or resin, a cyclic aliphatic series epoxy compound/or resin, a heterocyclic epoxy compound/or resin, a glycidyl ether series compound/or resin, a glycidyl ester series compound/or resin, glycidyl amine series compound/or resin, an epoxy compound of epoxidized oils/or resin; and brominated derivatives of the above epoxy compounds/or resins, and tris (glycidylphenyl) methane, triglycidyl isocyanurate, and the like. These epoxy compounds/or resins can be used singly or as a mixture of two or more kinds at arbitrary ratio as required.

Examples of commercially available products of epoxy resin [F] include but are not limited to Epikote 807, Epikote 815, Epikote 825, Epikote 827, Epikote 828, Epikote 190P, Epikote 191P (trade names; produced by Yuka Shell Epoxy KK), Epikote 1004, Epikote 1256 (trade names; produced by Japan Epoxy Resins Co., Ltd.), TECHMORE VG 3101L (trade name; produced by Mitsui Chemicals, Inc.), EPPN-501H, 502H (trade name; produced by Nippon Kayaku Co., Ltd), JER 1032H60 (trade name; produced by Japan Epoxy Resins Co., Ltd.), JER 157 S 65, 157 S 70 (trade name; produced by Japan Epoxy Resins Co., Ltd.), EPPN-201 (trade name; produced by Nippon Kayaku Co., Ltd.), JER 152, JER 154 (trade names; produced by Japan Epoxy Resins Co., Ltd.) EOCN-102S, EOCN-103S, EOCN-104S, EOCN-1020 (trade names; produced by Nippon Kayaku Co., Ltd.), Celloxide 2021P, EHPE-3150 (trade names, produced by Daicel Chemical Industries, Ltd.), Denacol EX-810, EX-830, EX-851, EX-611, EX-512, EX-421, EX-411, EX-321, EX-313, EX-201, EX-111 (trade names, produced by Nagase ChemteX Corporation), and the like.

<Organic Solvent>

The near-infrared absorbing composition of the present specification can include a solvent, so that the near-infrared absorbing dye [A] can be thoroughly dissolved in a monomer, resin or the like and applied on a substrate such as a glass substrate to a dry film thickness of 0.2 to 5 μm, to facilitate forming filter segments.

Examples of the organic solvent include ethyl lactate, benzyl alcohol, 1,2,3-trichloropropane, 1,3-butanediol, 1,3-butylene glycol, 1,3-butylene glycol diacetate, 1,4-dioxane, 2-heptanone, 2-methyl-1,3-propanediol, 3,5,5-trimethyl-2-cyclohexene-1-one, 3,3,5-trimethylcyclohexanone, ethyl-3-ethoxypropionate, 3-methyl-1,3-butanediol, 3-methoxy-3-methyl-1-butanol, 3-methoxy-3-methylbutyl acetate, 3-methoxybutanol, 3-methoxybutyl acetate, 4-heptanone, m-xylene, m-diethylbenzene, m-dichlorobenzene, N,N-dimethylacetamide, N,N-dimethylformamide, n-butyl alcohol, n-butylbenzene, n-propyl acetate, o-xylene, o-chlorotoluene, o-diethylbenzene, o-dichlorobenzene, p-chlorotoluene, p-diethylbenzene, sec-butylbenzene, tert-butylbenzene, γ-butyrolactone, isobutyl alcohol, isophorone, ethylene glycol diethyl ether, ethylene glycol dibutyl ether, ethylene glycol monoisopropyl ether, ethylene glycol monoethyl ether, ethylene glycol monoethyl ether acetate, ethylene glycol mono-tertiary butyl ether, ehylene glycol monobutyl ether, ehylene glycol monobutyl ether acetate, ethylene glycol monopropyl ether, ethylene glycol monohexyl ether, ethylene glycol monomethyl ether, ethylene glycol monomethyl ether acetate, diisobutyl ketone, diethylene glycol diethyl ether, diethylene glycol dimethyl ether, diethylene glycol monoisopropyl ether, diethylene glycol monoethyl ether acetate, diethylene glycol monobutyl ether, diethylene glycol monobutyl ether acetate, diethylene glycol monomethyl ether, cyclohexanol, cyclohexanol acetate, cyclohexanone, dipropylene glycol dimethyl ether, dipropylene glycol methyl ether acetate, dipropylene glycol monoethyl ether, dipropylene glycol monobutyl ether, dipropylene glycol monopropyl ether, dipropylene glycol monomethyl ether, diacetone alcohol, triacetin, tripropylene glycol monobutyl ether, tripropylene glycol monomethyl ether, propylene glycol diacetate, propylene glycol phenyl ether, propylene glycol monoethyl ether, propylene glycol monoethyl ether acetate, propylene glycol monobutyl ether, propylene glycol monopropyl ether, propylene glycol monomethyl ether, propylene glycol monomethyl ether acetate, propylene glycol monomethyl ether propionate, benzyl alcohol, methyl isobutyl ketone, methyl cyclohexanol, n-amyl acetate, n-butyl acetate, isoamyl acetate, isobutyl acetate, propyl acetate, dibasic acid esters, and the like.

Among them, it is preferable to use alkyl lactates such as ethyl lactate, glycol acetates such as propylene glycol monomethyl ether acetate, propylene glycol monoethyl ether acetate, ethylene glycol monomethyl ether acetate, ethylene glycol monoethyl ether acetate, aromatic alcohols such as benzyl alcohol, or ketones such as cyclohexanone.

One of these organic solvents may be used alone or a mixture of two or more may be used. In the case of using a mixture of two or more solvents, it is preferable that the preferred organic solvents mentioned above be contained in the range from 65 to 95% by weight relative to 100 parts by weight of the total organic solvent. In particular, it is preferable that propylene glycol monomethyl ether acetate be the main component, and be contained in the range from 65 to 100% by weight of the total organic solvent.

Further, since the organic solvent can adjust the near-infrared absorbing composition to an appropriate viscosity and form a filter segment having a desired uniform film thickness, it is preferable to use the organic solvent of 500 to 4000 parts by weight relative to 100 parts by weight of the total weight of the dye.

<Sensitizer>

Furthermore, the near-infrared absorbing composition of the present specification may contain a sensitizer. Examples of the sensitizer includes: unsaturated ketones represented by chalcone derivatives, dibenzalacetone and the like, 1,2-diketone derivatives represented by benzyl, camphorquinone and the like, benzoin derivatives, fluorene derivatives, naphthoquinone derivatives, anthraquinone derivatives, xanthene derivatives, thioxanthene derivatives, xanthone derivatives, thioxanthone derivatives, coumarin derivatives, ketocoumarin derivatives, polymethine dyes such as cyanine derivatives, merocyanine derivatives, oxonol derivatives, acridine derivatives, azine derivatives, thiazine derivatives, oxazine derivatives, indoline derivatives, azulene derivatives, azulenium derivatives, squarylium derivatives, porphyrin derivatives, tetraphenylporphyrin derivatives, triarylmethane derivatives, tetrabenzoporphyrin derivatives, tetrapyrazinoporphyrazine derivatives, phthalocyanine derivatives, tetraazaporphyrazine derivatives, tetraquinoxaliloporphyrazine derivatives, naphthalocyanine derivatives, subphthalocyanine derivatives, pyrylium derivatives, thiopyrylium derivatives, tetraphylline derivatives, annulene derivatives, spiropyran derivatives, spirooxazine derivatives, thiospiropyran derivatives, metal arene complexes, organic ruthenium complexes or Michler's ketone derivatives, biimidazole derivatives, α-acyloxy ester, acylphosphine oxide, methylphenylglyoxylate, benzyl, 9,10-phenanthrenequinone, camphor quinone, ethyl anthraquinone, 4,4'-diethyl isophthalophenone, 3,3' or 4,4'-tetra (t-butyl peroxycarbonyl) benzophenone, 4,4'-diethylaminobenzophenone, and the like.

More specifically, the sensitizer may be, but is not limited to, those described in detail in "Dye Handbook" (1986, Kodansha) edited by Makoto Ogawara et al., "Chemistry of Functional Dyes" (1981, CMC) edited by Tadasaburo Ikemori et al., and "Special Function Materials" (1986, CMC). In addition, a sensitizer which absorbs light from ultraviolet to near-infrared region can be contained.

Two or more sensitizers may be used at an arbitrary ratio as required. The amount of the sensitizer to be used is preferably in the range from 3 to 60 parts by weight relative to 100 parts by weight of the total weight of the photopolymerization initiator [E] contained in the near-infrared absorbing composition, and more preferably in the range from 5 to 50 parts by weight from the viewpoint of photocurability and developability.

<Polyfunctinal Thiol>

The near-infrared absorbing composition of the present specification can contain a polyfunctional thiol functioning as a chain transfer agent.

The polyfunctional thiol may be a compound having two or more thiol groups. Examples thereof include hexanedithiol, decanedithiol, 1,4-butanediol bisthiopropionate, 1,4-butanediol bisthioglycolate, ethylene glycol bisthioglycolate, ethylene glycol bisthiopropionate, trimethylolpropane tris thioglycolate, trimethylol propane tris thiopropionate, trimethylol propane tris (3-mercaptobutyrate), pentaerythritol tetrakis thioglycolate, pentaerythritol tetrakis thiopropionate, tris (2-hydroxyethyl) isocyanurate trimercaptopropionate, 1,4-dimethyl mercaptobenzene, 2,4,6-trimercapto-s-triazine, 2-(N,N-dibutylamino)-4,6-dimercapto-s-triazine.

These polyfunctional thiols can be used singly or as a mixture of two or more kinds at arbitrary ratio as required.

The content of the functional thiol is preferably in the range from 0.1 to 30% by weight, more preferably from 1 to 20% by weight relative to the weight of the total solid content of the near-infrared absorbing composition (100% by weight). When the polyfunctional thiol content is less than 0.1% by weight, the effect of adding the polyfunctional thiol is insufficient, and if it exceeds 30% by weight, the sensitivity is too high and conversely the resolution is lowered.

<Antioxidant>

The near-infrared absorbing composition of the present specification may contain an antioxidant. Since the antioxidant prevents the photopolymerization initiator and the thermosetting compound contained in the near-infrared absorbing composition from being oxidized and being yellowed by a thermal process at the time of thermal curing or ITO annealing, the transmittance of the coating film can be increased. Therefore, by including an antioxidant, it is possible to prevent yellowing due to oxidation at the heating step and to obtain high transmittance of the coating film.

The "antioxidant" in the present specification may be a compound having an ultraviolet absorbing function, a radical scavenging function, or a peroxide decomposing function. Specifically, the antioxidant may be a compound of a hindered phenol series, a hindered amine series, a phosphorus series, a sulfur series, a benzotriazole series, a benzophenone series, a hydroxylamine series, a salicylate ester series or a triazine series, and a known ultraviolet absorber, antioxidant, and the like can be used.

Among them, preferable antioxidants are a hindered phenol series antioxidant, a hindered amine series antioxidant, a phosphorus series antioxidant and a sulfur series antioxidant, from the viewpoint of compatibility between the transmittance and sensitivity of the coating film. More preferable antioxidants are a hindered phenol series antioxidant, a hindered amine series antioxidant, or a phosphorus series antioxidant.

These antioxidants can be used singly or as a mixture of two or more kinds at an arbitrary ratio as required. It is more preferable that the content of the antioxidant be in the range from 0.5 to 5.0% by weight relative to the solid content weight of the near-infrared absorbing composition (100% by weight), because the sensitivity is satisfactory in that case.

<Amine Series Compound>

The near-infrared absorbing composition of the present specification may contain an amine series compound having a function of reducing dissolved oxygen. Examples of the amine series compounds include triethanolamine, methyldiethanolamine, triisopropanolamine, methyl 4-dimethylaminobenzoate, ethyl 4-dimethylaminobenzoate, isoamyl 4-dimethylaminobenzoate, 2-dimethylaminoethyl benzoate, 2-ethylhexyl (4-dimethylamino)benzoate, and N,N-dimethylparatoluidine.

<Leveling Agent>

It is preferable that a leveling agent be added to the near-infrared absorbing composition of the present specification to improve the leveling property of the composition on the transparent substrate. As the leveling agent, dimethylsiloxane having a polyether structure or polyester structure in the main chain is preferable. Specific examples of the dimethylsiloxane having a polyether structure in the main chain include FZ-2122 produced by Dow Corning Toray Co., Ltd. and BYK-333 produced by BYK Chemie. Specific examples of the dimethylsiloxane having a polyester structure in the main chain include BYK-310 and BYK-370 produced by BYK-Chemie. Dimethylsiloxane having a polyether structure in the main chain and dimethylsiloxane having a polyester structure in the main chain can be used in combination. The content of the leveling agent is preferably in the range from 0.003 to 0.5% by weight in the total of 100% by weight of the near-infrared absorbing composition.

As a particularly preferable leveling agent, a useful one is a kind of surfactant that includes a hydrophobic group and a hydrophilic group in a molecule, that has a feature of low solubility in water though it has a hydrophilic group and low surface tension lowering ability when added to a coloring composition, that further has good wettability to a glass plate despite its low surface tension lowering ability, and that can sufficiently suppress chargeability at an addition amount at which a coating film defect due to foaming does not occur. As the leveling agent having such preferable properties, dimethylpolysiloxane having a polyalkylene oxide unit can be preferably used. The polyalkylene oxide unit includes a polyethylene oxide unit and a polypropylene oxide unit, and dimethyl polysiloxane may have both a polyethylene oxide unit and a polypropylene oxide unit.

In addition, the form of bonding of dimethylpolysiloxane with the polyalkylene oxide unit can be any of a pendant type in which the polyalkylene oxide unit is bonded to a repeating unit of dimethylpolysiloxane, a terminal-modified type in which the polyalkylene oxide unit is bonded to the terminal of dimethylpolysiloxane, or a linear block copolymer type in which the polyalkylene oxide unit and dimethylpolysiloxane are alternately repeatedly bonded. Dimethylpolysiloxane having a polyalkylene oxide unit is commercially available from Dow Corning Toray Co., Ltd., and examples thereof include, but are not limited to FZ-2110, FZ-2122, FZ-2130, FZ-2166, FZ-2191, FZ-2203, and FZ-2207.

An anionic, cationic, nonionic, or amphoteric surfactant can be supplementarily added to the leveling agent. Two or more surfactants may be used as a mixture.

Examples of the anionic surfactant supplementarily added to the leveling agent include polyoxyethylene alkyl ether sulfate, sodium dodecylbenzene sulfonate, an alkali salt of a styrene-acrylic acid copolymer, sodium alkyl naphthalene sulfonate, sodium alkyl diphenyl ether disulfonate, lauryl sulfate monoethanolamine, lauryl sulfate triethanolamine, lauryl sulfate ammonium, monoethanolamine stearate, sodium stearate, sodium lauryl sulfate, monoethanolamine of a styrene-acrylic acid copolymer, polyoxyethylene alkyl ether phosphate ester, and the like.

Examples of the cationic surfactant supplementarily added to the leveling agent include an alkyl quaternary ammonium salt and an ethylene oxide adduct thereof. Examples of the nonionic surfactant supplementarily added to the leveling agent include polyoxyethylene oleyl ether, polyoxyethylene lauryl ether, polyoxyethylene nonyl phenyl ether, polyoxyethylene alkyl ether phosphate ester, polyoxyethylene sorbitan monostearate, polyethylene glycol monolaurate and the like; an amphoteric surfactant, such as alkylbetaine such as alkyldimethylaminoacetic betaine, and alkylimidazoline. A fluorine-series or silicone-series surfactant may also be added to the leveling agent.

<Curing Agent and Cure Accelerating Agent>

In order to assist the curing of the thermosetting resin, the near-infrared absorbing composition of the present specification may contain a curing agent, a curing accelerator, etc., if necessary. As the curing agent, a phenolic resin, an amine-series compound, an acid anhydride, an active ester, a carboxylic acid compound, a sulfonic acid compound and the like are effective, but the curing agent is not particularly limited thereto, and any curing agent may be used as long as it is capable of reacting with a thermosetting resin. Among them, a compound having two or more phenolic hydroxyl groups in one molecule and an amine series curing agent are preferable. Examples of the curing accelerator include amine compounds (for example, dicyandiamide, benzyldimethylamine, 4-(dimethylamino)-N,N-dimethylbenzylamine, 4-methoxy-N,N-dimethylbenzylamine, 4-methyl-N,N-dimethylbenzylamine, etc.), quaternary ammonium salt compounds (for example, triethylbenzylammonium chloride etc.), blocked isocyanate compounds (for example, dimethylamine etc.), imidazole derivatives of bicyclic amidine compounds and salts thereof (for example, imidazole, 2-methylimidazole, 2-ethylimidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole, etc.), phosphorus compounds (for example, triphenylphosphine, etc.), guanamine compounds (for example, melamine, guanamine, acetoguanamine, benzoguanamine, etc.), S-triazine derivatives (for example, 2,4-diamino-6-methacryloyloxyethyl-S-triazine, 2-vinyl-2,4-diamino-S-triazine, 2-vinyl-4,6-diamino-S-triazine-isocyanuric acid adduct, 2,4-diamino-6-methacryloyloxyethyl-S-triazine-isocyanuric acid adduct, etc.). These may be used alone, or two or more of them may be used in combination. The content of the cure accelerating agent is preferably in the range from 0.01 to 15 parts by weight relative to 100 parts by weight of the thermosetting resin.

<Other Near-Infrared Absorbing Dyes>

The near-infrared absorbing composition of the present specification can contain a near-infrared absorbing dye other than the near-infrared absorbing dye [A] of the present specification. Examples of the near-infrared absorbing dyes other than the near-infrared absorbing dyes [A] that can be used in the near-infrared absorbing composition of the present specification include, but are not limited to, a cyanine compound, a squarylium compound, a phthalocyanine compound, a naphthalocyanine compound, an aminium compound, a diimmonium compound, a croconium compound, an azo compound, a quinoid type complex compound, a dithiol metal complex compound, and the like.

<Other Additive Components>

The near-infrared absorbing composition of the present specification can contain a storage stabilizer to stabilize the viscosity over time of the composition. In order to enhance the adhesion to a transparent substrate, the near-infrared absorbing composition can also contain an adhesion improving agent such as a silane coupling agent or the like.

Examples of the storage stabilizing agent include a quaternary ammonium chloride such as benzyl trimethyl chloride and diethylhydroxyamine, an organic acid such as lactic acid and oxalic acid and methyl ethers thereof, t-butylpyrocatechol, an organic phosphine such as tetraethylphosphine and tetraphenylphosphine, phosphite, and the like. The storage stabilizing agent may be used in an amount of 0.1 to 10 parts by weight relative to 100 parts by weight of the total amount of the coloring agent.

The adhesion improving agent may be silane coupling agents, including vinylsilanes, such as vinyltris (β-methoxyethoxy) silane, vinylethoxysilane and vinyltrimethoxysilane, (meth)acrylsilanes, such as γ-methacryloxypropyltrimethoxysilane, epoxysilanes, such as β-(3,4-epoxycyclohexyl) ethyltrimethoxysilane, β-(3,4-epoxycyclonexyl) methyltrimethoxysilane, β-(3,4-epoxycyclohexyl) ethyltriethoxysilane, β-(3,4-epoxycyclohexyl)methyltriethoxysilane, γ-glycidoxypropyltrimethoxysilane and γ-glycidoxypropyltriethoxysilane, aminosilanes, such as N-β (aminoethyl) γ-aminopropyltrimethoxysilane, N-β (amino ethyl) γ-aminopropyltriethoxysilane, N-β (aminoethyl) γ-aminopropylmethyldiethoxysilane, γ-aminopropyltriethoxysilane, γ-aminopropyltrimethoxysilane, N-phenyl-γ-aminopropyltrimethoxysilane, N-phenyl-γ-aminopropyltriethoxysilane, and thiosilanes, such as γ-mercaptopropyltrimethoxysilane and γ-mercaptopropyltriethoxysilane. The adhesion improving agent can be used in an amount in the range from 0.01 to 10 parts by weight, preferably from 0.05 to 5 parts by weight relative to 100 parts by weight of the coloring agent in the coloring composition.

<Method for Producing Near-Infrared Absorbing Composition for Solid-State Imaging Device>

The near-infrared absorbing composition of the solid-state imaging device of the present specification can be obtained by dispersing the near-infrared absorbing dye [A] in a resin using a resin-based dispersant. As the resin, the resin-based dispersant [B1] itself or the binder resin [C] may be used. As a specific production method of the near-infrared absorbing composition of the present specification, a near-infrared absorbing dye [A] is mixed with the resin-based dispersant [B1] and, if necessary, the binder resin [C], an organic solvent, and another dispersion aid, and thereafter finely dispersing the mixture using various dispersing means, such as a kneader, a two-roll mill, a three-roll mill, a ball mill, a horizontal sand mill, a vertical sand mill, an annular bead mill or an attritor.

<Removal of Coarse Particles>

It is preferable that coarse particles having a size of 5 μm or more, preferably coarse particles having a particle size of 1 μm or more, more preferably 0.5 μm or more and mixed dust, be removed from the near-infrared absorbing composition of the present specification by means of centrifugal separation, sintering filter, membrane filter, or the like. Thus, the near-infrared absorbing composition does not substantially contain particles of, preferably 0.5 μm or more. More preferably, the particles contained in the near-infrared absorbing composition are 0.3 μm or less.

<Method for Producing Near-Infrared Absorbing Filter for Solid-State Imaging Device>

The near-infrared absorbing filter for a solid-state imaging device of the present specification can be produced by a printing method, a photolithography method or an etching method.

In the formation of the filter segment by the printing method, patterning can be achieved merely by repeating printing and drying of the near-infrared absorbing composition prepared as a printing ink. Therefore, this method as a method for producing the filter is low-cost and excellent in mass productivity. Furthermore, due to the development of printing technology, it is possible to print fine patterns with high dimensional accuracy and smoothness. In order to perform printing, the composition is preferably such that the ink does not dry or solidify on the printing plate or on the blanket. Since controlling the fluidity of the ink on the printing press is important, it is possible to adjust the ink viscosity by the dispersant and extender pigments.

In the case of forming a filter segment by the photolithography method, the near-infrared absorbing composition prepared as the solvent development type or alkali development type resist material is applied to a transparent substrate by spray coating, spin coating, slit coating, roll coating or the like in such a manner that the dry film thickness becomes 0.2 to 5 μm. Ultraviolet exposure is performed on the dried film, if necessary, through a mask having a predetermined pattern provided in contact with or in a non-contact state with the film. Thereafter, by dipping in a solvent or an alkali developing solution or by spraying a developing solution by a spray or the like to remove the uncured portion to form a desired pattern, and repeating the same operation for the other colors, the filter can be produced. Further, in order to accelerate the polymerization of the resist material, heating may be performed if necessary. According to the photolithography method, it is possible to produce a filter with higher accuracy than that of a filter produced by the printing method described above.

In the case where the filter segment is formed by the etching method, either dry etching or wet etching can be applied. Dry etching is a method of etching a material with a reactive gas (etching gas), ions, or radicals. In contrast, wet etching is a method of etching a material with a liquid. In consideration of production cost, wet etching with acid or alkali is preferable. On the other hand, in consideration of reproducibility of formation of recesses and protrusions, dry etching suitable for fine processing is preferable.

Dry etching includes a method of exposing the material to a reactive gas (reactive gas etching), reactive ion etching of ionizing or radicalizing the gas by plasma, and the like.

In dry etching apparatuses by reactive ion etching, various methods are applied. The apparatus configurations in all methods are almost the same. Specifically, an electromagnetic wave or the like is applied to the etching gas in a chamber maintained at a required vacuum pressure, thereby converting the gas into a plasma. At the same time, a high frequency voltage is applied to the cathode on which a sample substrate is placed in the chamber. As a result, the ion species and the radical species in the plasma are accelerated in the direction of the sample and collide with the sample to cause sputtering by ions and a chemical reaction of the etching gas at the same time, thereby microfabricating the sample.

In this embodiment, it is possible to perform an etching treatment on a colored pattern directly after forming the colored pattern by the above-described process. Alternatively, a resist pattern to be a mask may be formed on a colored pattern by using a photolithography technique, and then an etching process may be performed on the colored pattern portion exposed therefrom. According to this method, it is possible to provide recesses and protrusions by selecting a colored pattern of a desired color from a plurality of colored patterns, and furthermore to provide recesses and protrusions to a desired extent at a desired position.

For development, an aqueous solution of sodium carbonate, sodium hydroxide or the like is used as an alkali developing solution, and an organic alkali such as dimethylbenzylamine, triethanolamine or the like can also be used. An antifoaming agent or a surfactant can also be added to the developing solution. In order to improve the sensitivity of ultraviolet exposure, ultraviolet exposure can also be performed after the color resist material is applied and dried, and then a water-soluble or alkaline water-soluble resin, such as polyvinyl alcohol or water-soluble acrylic resin, is applied and dried to form a film for preventing polymerization inhibition by oxygen.

The near-infrared absorbing filter of the present specification can be produced by an electrodeposition method, a transfer method, an ink-jet method or the like besides the above method, but the near-infrared absorbing composition of the present specification can be used for any method. The electrodeposition method is a method using a transparent conductive film formed on a substrate. In the method, a color filter is produced by electrodepositing filter segment of each color on the transparent conductive film by electrophoresis of colloidal particles. The transfer method is a method in which a filter segment is previously formed on the surface of a peelable transfer base sheet, and the filter segment is transferred to a desired substrate.

<Use Application of Near-Infrared Absorbing Filter>

The near-infrared absorbing filter of the present specification has a wide viewing angle and has excellent near-infrared cut performance and the like. Further, it is low in absorption in the visible region (400 nm to 700 nm), is excellent in near-infrared absorptivity, and is excellent in durability such as heat resistance and light resistance. Therefore, it is useful for correcting the visibility of a solid-state imaging device, such as a CCD or a CMOS image sensor of a camera module. Particularly, it is useful for a digital still camera, a mobile phone camera, a digital video camera, a PC camera, a monitoring camera, a car camera, a television, a car navigation system, a personal digital assistant, a personal computer, a video game, a portable game machine, a fingerprint authentication system, a digital music player, and the like.

<Solid-State Imaging Device>

In recent years, imaging apparatuses have been widely used with the expansion of the contents of image recording, communication, and broadcasting. Although various types of imaging apparatuses have been proposed, imaging apparatuses using compact, lightweight, multicolor and high-performance solid-state imaging devices, which are stably produced, have become widespread. The solid-state imaging device includes a plurality of photoelectric conversion elements that receive an optical image from an object to be photographed and convert the incident light into an electric signal. The types of photoelectric conversion elements are roughly divided into a CCD (charge coupled device) type and a CMOS (complementary metal oxide semiconductor) type. Further, the arrangements of photoelectric conversion elements are divided into two types: a linear sensor (line sensor) in which photoelectric conversion elements are arranged in one row, and an area sensor (surface sensor) in which photoelectric conversion elements are arrayed two-dimensionally in rows and columns. In either sensor, the larger the number of photoelectric conversion elements (the number of pixels), the more precise the photographed image is.

In addition, color sensors configured to obtain color information of an object by disposing various color filters, which transmit light of a specific wavelength, in the path of light incident on the photoelectric conversion elements, are also in widespread use. Common colors of the color filters are three-primary color system composed of hues of three colors of red (R), blue (B), and green (G), or complementary color system composed of hues of three colors of cyan (C), magenta (M), and yellow (Y).

EXAMPLES

Hereinafter, the present specification will be described in more detail with reference to Examples, but the present specification is not limited to the following Examples. In the examples and comparative examples, "parts" and "%" mean "parts by mass" and "% by mass", respectively. Also, "PGMAc" represents propylene glycol monomethyl ether acetate, "ARONIX M-350" represents trimethylolpropane EO modified triacrylate, "ARONIX M-309" represents trimethylolpropane triacrylate, "IRGACURE 379" represents 2-dimethylamino-2-[(4-methylphenyl)methyl]-1-[4-(4-morpholinyl)phenyl]-1-butanone, and "IRGACURE 907" represents 2-methyl-1-(4-methylthiophenyl)-2-morpholinopropane-1-one, "OXE-01" represents 1,2-octanedione, 1-[4-(phenylthio)phenyl-, 2-(O-benzoyl oxime)], "OXE-02" represents ethanone, 1-[9-ethyl-6-(2-methylbenzoyl)-9H-carbazol-3-yl]-, 1-(O-acetyloxime), "IRGANOX 1010" represents a tetrakis [3-(3',5'-di-t-butyl-4'-hydroxy phenyl) propionic acid] pentaerythritol, and "EX-611" represents sorbitol polyglycidyl ether.

(Method for Identifying Near-Infrared Absorbing Dye [A])

The MALDI TOF-MS spectrum was used for identification of the near-infrared absorbing dye [A] used in the present specification. Identification of an obtained compound by the MALDI TOF-MS spectrum is performed by, using a MALDI mass spectrometer autoflex III produced by Bruker-Daltonics Corp., and based on agreement between the molecular ion peak of the obtained mass spectrum and the mass number obtained by calculation.

(Acid Values of Resin-Based Dispersant [B1] and Binder Resin [C])

Acid values of a resin-based dispersant [B1] and a binder resin [C] were determined by a potentiometric titration method using a 0.1 N potassium hydroxide ethanol solution. The acid values of the binder resin [C] and the resin-based dispersant [B1] indicate the acid values of the solid contents.

(Weight Average Molecular Weight (Mw) of Resin-Based Dispersant and Binder Resin)

The weight average molecular weights (Mw) of the resin-based dispersant [B1] and the binder resin [C] are weight average molecular weights (Mw) in terms of polystyrene measured using THF as a developing solvent by GPC (HLC-8120 GPC, produced by Tosoh Corporation) equipped with an RI detector using a TSK gel column (produced by Tosoh Corporation).

(Amine Value of Resin-Based Dispersant [B1])

The amine value of the resin-based dispersant [B1] was determined by a potentiometric titration method using a 0.1 N hydrochloric acid aqueous solution and then converted into an equivalent amount of potassium hydroxide. The amine value of the resin-based dispersant [B1] indicates the amine value of the solid content.

<Method for Producing Near-Infrared Absorbing Dye [A]>

(Production of Near-Infrared Absorbing Dye [A-1])

40.0 parts of 1,8-diaminonaphthalene, 25.1 parts of cyclohexanone, and 0.087 parts of p-toluenesulfonic acid monohydrate were mixed with 400 parts of toluene, and the mixture was heated and stirred in a nitrogen gas atmosphere, and refluxed for three hours. The water produced during the reaction was removed from the system by azeotropic distillation.

After completion of the reaction, the dark brown solid obtained by distilling toluene was extracted with acetone, and purified by recrystallization from a mixed solvent of acetone and ethanol. The obtained brown solid was dissolved in a mixed solvent of 240 parts of toluene and 160 parts of n-butanol, and 13.8 parts of 3,4-dihydroxy-3-cyclobutene-1, 2-dione were added. The mixture was heated and stirred in a nitrogen gas atmosphere, and refluxed for eight hours. The water produced during the reaction was removed from the system by azeotropic distillation.

After completion of the reaction, the solvent was distilled and 200 parts of hexane were added while stirring the obtained reaction mixture. The obtained black brown precipitate was filtered, washed successively with hexane, ethanol and acetone, and dried under reduced pressure to obtain 61.9 parts (yield: 920) of near-infrared absorbing dye [A-1]. As a result of mass spectrometry by TOF-MS, the near-infrared absorbing dye [A-1] was identified.

Near-Infrared Absorbing Dye [A-1]

[Chemical Formula 5]

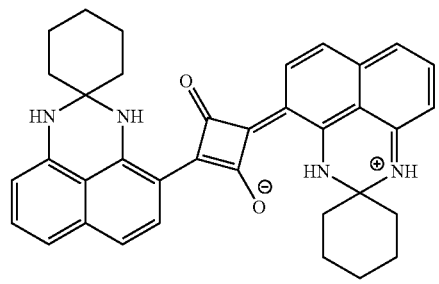

(Production of Near-Infrared Absorbing Dye [A-2])

The same process as in the production of the near-infrared absorbing dye [A-1] was performed, except that 32.2 parts of 2,6-dimethylcyclohexanone were used in place of 25.1 parts of cyclohexanone used in the production of the near-infrared absorbing dye [A-1], and 71.9 parts (yield: 97%) of a near-infrared absorbing dye [A-2] were obtained. As a result of mass spectrometry by TOF-MS, the near-infrared absorbing dye [A-2] was identified.

Near-Infrared Absorbing Dye [A-2]

[Chemical Formula 6]

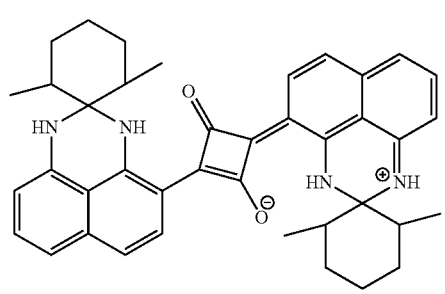

(Production of Near-Infrared Absorbing Dye [A-3])

The same process as in the production of the near-infrared absorbing dye [A-1] was performed, except that 32.2 parts of 3,5-dimethylcyclohexanone were used in place of 25.1 parts of cyclohexanone used in the production of the near-infrared absorbing dye [A-1], and 72.6 parts (yield: 980) of a near-infrared absorbing dye [A-3] were obtained. As a result of mass spectrometry by TOF-MS, the near-infrared absorbing dye [A-3] was identified.

Near-Infrared Absorbing Dye [A-3]

[Chemical Formula 7]

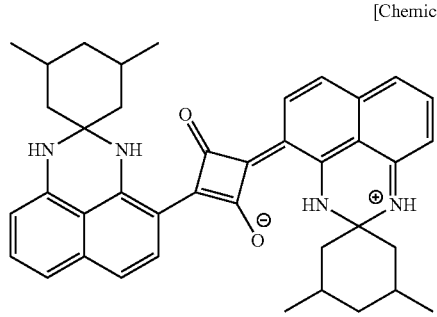

(Production of Near-Infrared Absorbing Dye [A-4])

The same process as in the production of the near-infrared absorbing dye [A-1] was performed, except that 28.6 parts of 4-methylcyclohexanone were used in place of 25.1 parts of cyclohexanone used in the production of the near-infrared absorbing dye [A-1], and 67.2 parts (yield: 95%1 of a near-infrared absorbing dye [A-4] were obtained. As a result of mass spectrometry by TOF-MS, the near-infrared absorbing dye [A-4] was identified.

Near-Infrared Absorbing Dye [A-4]

[Chemical Formula 8]

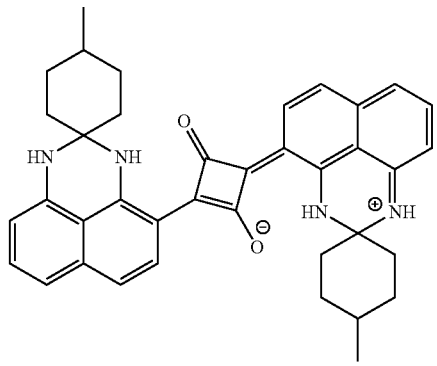

(Production of Near-Infrared Absorbing Dye [A-5])

The same process as in the production of the near-infrared absorbing dye [A-1] was performed, except that 35.8 parts of 3,3,5-trimethylcyclohexanone were used in place of 25.1 parts of cyclohexanone used in the production of the near-infrared absorbing dye [A-1], and 71.3 parts (yield: 92%) of a near-infrared absorbing dye [A-5] were obtained. As a result of mass spectrometry by TOF-MS, the near-infrared absorbing dye [A-5] was identified.

Near-Infrared Absorbing Dye [A-5]

[Chemical Formula 9]

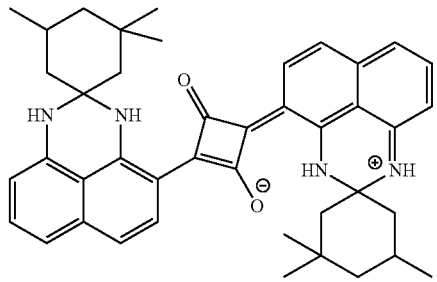

(Production of Near-Infrared Absorbing Dye [A-6])

The same process as in the production of the near-infrared absorbing dye [A-1] was performed, except that 39.4 parts of 3,5-diethyl cyclohexanone were used in place of 25.1 parts of cyclohexanone used in the production of the near-infrared absorbing dye [A-1], and 76.9 parts (yield: 95%) of a near-infrared absorbing dye [A-6] were obtained. As a result of mass spectrometry by TOF-MS, the near infrared absorbing dye [A-6] was identified.

Near-Infrared Absorbing Dye [A-6]

[Chemical Formula 10]

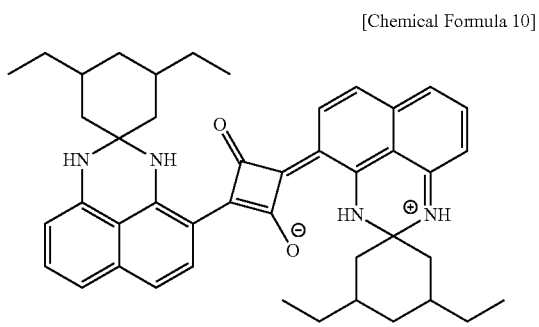 [SMILES: CCC1CC(CC)CC2(C1)Nc1cccc3ccc(C4=C([O-])/C(=c5/ccc6cccc7c6c5NC5(CC(CC)CC(CC)C5)[NH+]=7)C4=O)c(c13)N2]

(Production of Near-Infrared Absorbing Dye [A-7])

The same process as in the production of the near-infrared absorbing dye [A-1] was performed, except that 39.4 parts of 5-isopropyl-2-methylcyclohexanone were used in place of 25.1 parts of cyclohexanone used in the production of the near-infrared absorbing dye [A-1], and 76.9 parts (yield: 95%) of a near-infrared absorbing dye [A-7] were obtained. As a result of mass spectrometry by TOF-MS, the near infrared absorbing dye [A-7] was identified.

Near-Infrared Absorbing Dye [A-7]

[Chemical Formula 11]

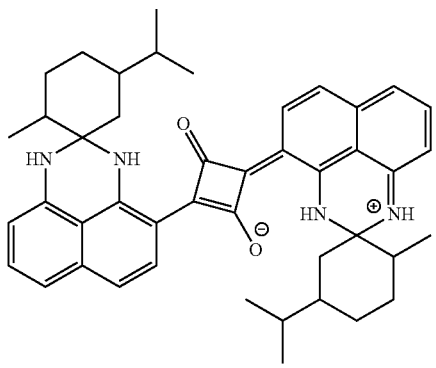

(Production of Near-Infrared Absorbing Dye [A-8])

The same process as in the production of the near-infrared absorbing dye [A-1] was performed, except that 46.0 parts of 2-cyclohexylcyclohexanone were used in place of 25.1 parts of cyclohexanone used in the production of the near-infrared absorbing dye [A-1], and 79.4 parts (yield: 91%) of a near infrared absorbing dye [A-8] were obtained. As a result of mass spectrometry by TOF-MS, the near infrared absorbing dye [A-8] was identified.

Near-Infrared Absorbing Dye [A-8]

[Chemical Formula 12]

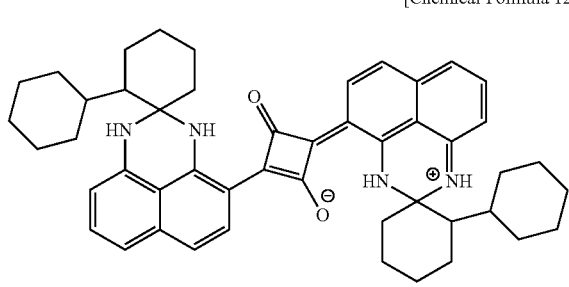

(Production of Near-Infrared Absorbing Dye [A-9])

The same process as in the production of the near-infrared absorbing dye [A-1] was performed, except that 28.1 parts of 2-norbornanone were used in place of 25.1 parts of cyclohexanone used in the production of the near-infrared absorbing dye [A-1], and 64.6 parts (yield: 92%) of a near-infrared absorbing dye [A-9] were obtained. As a result of mass spectrometry by TOF-MS, the near infrared absorbing dye [A-9] was identified.

Near-Infrared Absorbing Dye [A-9]

[Chemical Formula 13]

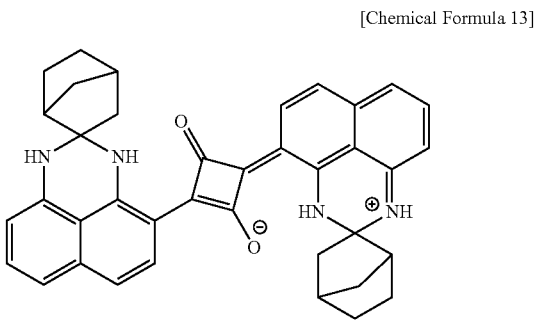 [SMILES: O=C1C(c2ccc3cccc4c3c2NC2(CC3CCC2C3)N4)=C([O-])/C1=c1/ccc2cccc3c2c1NC1(CC2CCC1C2)[NH+]=3]

(Production of Near-Infrared Absorbing Dye [A-10])

The same process as in the production of the near-infrared absorbing dye [A-1] was performed, except that 42.5 parts of spiro [5.5] undecane-1-one were used in place of 25.1 parts of cyclohexanone used in the production of the near-infrared absorbing dye [A-1], and 78.8 parts (yield: 94%) of a near infrared absorbing dye [A-10] were obtained. As a result of mass spectrometry by TOF-MS, the near infrared absorbing dye [A-10] was identified.

Near-Infrared Absorbing Dye [A-10]

[Chemical Formula 14]

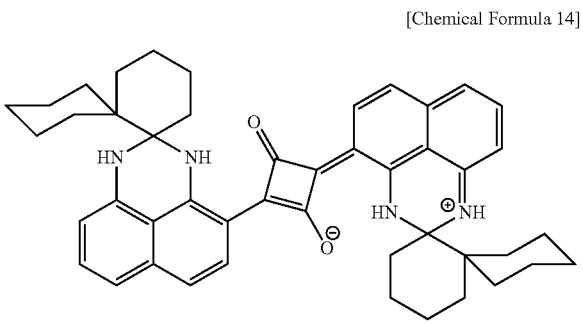 [SMILES: O=C1C(c2ccc3cccc4c3c2NC2(CCCCC23CCCCC3)N4)=C([O-])/C1=c1/ccc2cccc3c2c1NC1(CCCCC12CCCCC2)[NH+]=3]

(Production of Near-Infrared Absorbing Dye [A-11])

The same process as in the production of the near-infrared absorbing dye [A-1] was performed, except that 41.9 parts of 3-methyl-3, 4, 4a, 5, 8, 8a-hexahydronaphthalene-1(2H)-one in place of 25.1 parts of cyclohexanone used in the production of the near-infrared absorbing dye [A-1], and 76.7 parts (yield: 920) of a near-infrared absorbing dye [A-11] were obtained. As a result of mass spectrometry by TOF-MS, the near infrared absorbing dye [A-11] was identified.

Near-Infrared Absorbing Dye [A-11]

[Chemical Formula 15]

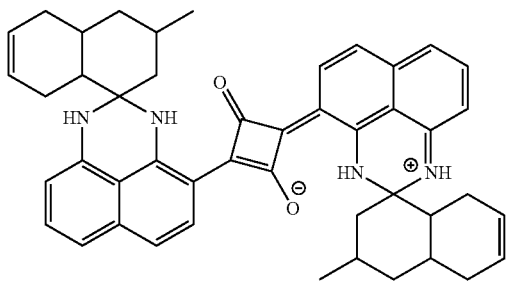

(Production of Near-Infrared Absorbing Dye [A-12])

The same process as in the production of the near-infrared absorbing dye [A-1] was performed, except that 41.0 parts of 3-(2-chloroethyl) cyclohexanone were used in place of 25.1 parts of cyclohexanone used in the production of the near-infrared absorbing dye [A-1], and 77.5 parts (yield: 94%) of a near-infrared absorbing dye [A-12] were obtained. As a result of mass spectrometry by TOF-MS, the near infrared absorbing dye [A-12] was identified.

Near-Infrared Absorbing Dye [A-12]

[Chemical Formula 16]

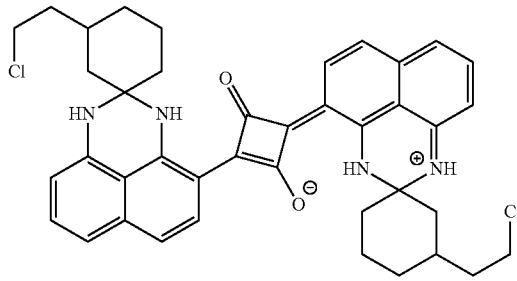

(Production of Near-Infrared Absorbing Dye [A-13])

The same process as in the production of the near-infrared absorbing dye [A-1] was performed, except that 59.8 parts of 3,5-di(trifluoromethyl) cyclohexanone were used in place of 25.1 parts of cyclohexanone used in the production of the near-infrared absorbing dye [A-1], and 93.3 parts (yield: 93%) of a near-infrared absorbing dye [A-13] were obtained. As a result of mass spectrometry by TOF-MS, the near infrared absorbing dye [A-13] was identified.

Near-Infrared Absorbing Dye [A-13]

[Chemical Formula 17]

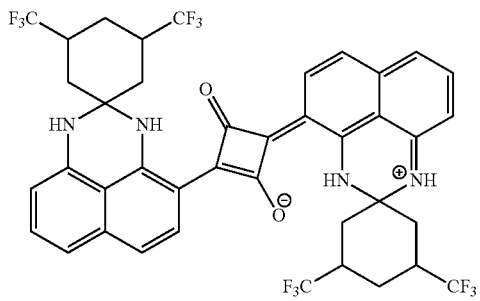

(Production of Near-Infrared Absorbing Dye [A-14])

The same process as in the production of the near-infrared absorbing dye [A-1] was performed, except that 44.5 parts of 2-phenylcyclohexanone were used in place of 25.1 parts of cyclohexanone used in the production of the near-infrared absorbing dye [A-1], and 78.9 parts (yield: 92%) of a near-infrared absorbing dye [A-14] were obtained. As a result of mass spectrometry by TOF-MS, the near infrared absorbing dye [A-14] was identified.

Near-Infrared Absorbing Dye [A-14]

[Chemical Formula 18]

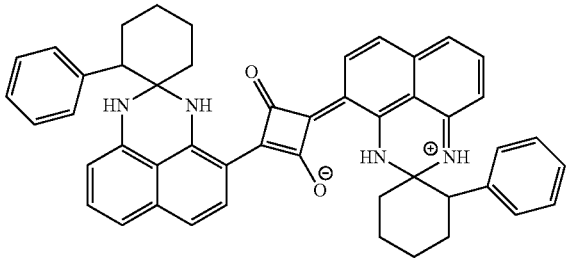

(Production of Near-Infrared Absorbing Dye [A-15])

The same process as in the production of the near-infrared absorbing dye [A-1] was performed, except that 48.1 parts of 4-p-tolylcyclohexanone were used in place of 25.1 parts of cyclohexanone used in the production of the near-infrared absorbing dye [A-1], and 84.7 parts (yield: 95%) of a near-infrared absorbing dye [A-15] were obtained. As a result of mass spectrometry by TOF-MS, the near infrared absorbing dye [A-15] was identified.

Near-Infrared Absorbing Dye [A-15]

[Chemical Formula 19]

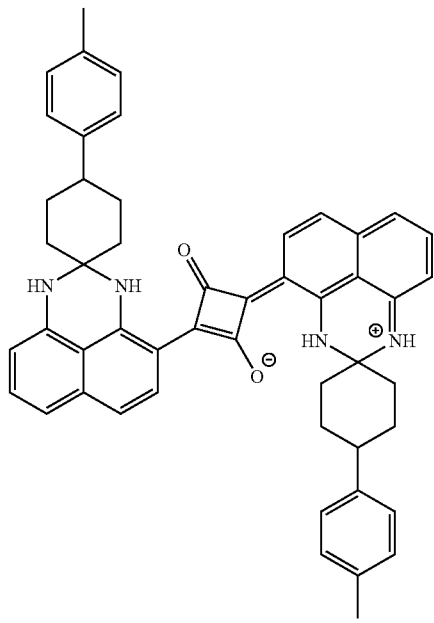

(Production of Near-Infrared Absorbing Dye [A-16])

The same process as in the production of the near-infrared absorbing dye [A-1] was performed, except that 48.1 parts of 4-benzylcyclohexanone were used in place of 25.1 parts of cyclohexanone used in the production of the near-infrared absorbing dye [A-1], and 85.6 parts (yield: 96%) of a near-infrared absorbing dye [A-16] were obtained. As a result of mass spectrometry by TOF-MS, the near infrared absorbing dye [A-16] was identified.

Near-Infrared Absorbing Dye [A-16]

[Chemical Formula 20]

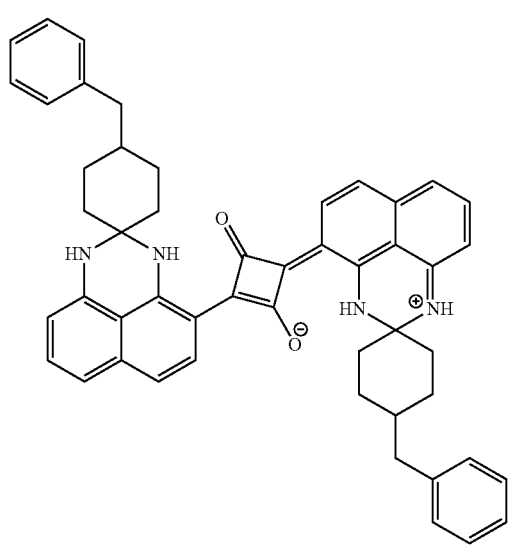

(Production of Near-Infrared Absorbing Dye [A-17])

The same process as in the production of the near-infrared absorbing dye [A-1] was performed, except that 36.3 parts of 4-ethoxycyclohexanone were used in place of 25.1 parts of cyclohexanone used in the production of the near-infrared absorbing dye [A-1], and 71.0 parts (yield: 91%) of a near-infrared absorbing dye [A-17] were obtained. As a result of mass spectrometry by TOF-MS, the near infrared absorbing dye [A-17] was identified.

Near-Infrared Absorbing Dye [A-17]

[Chemical Formula 21]

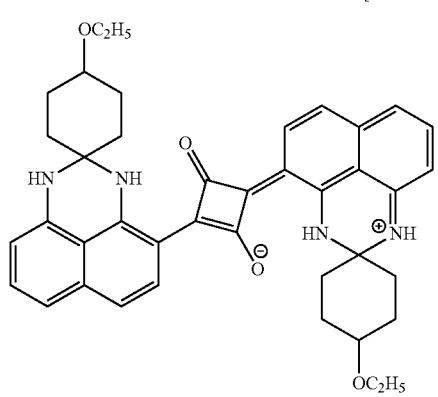

(Production of Near-Infrared Absorbing Dye [A-18])

The same process as in the production of the near-infrared absorbing dye [A-1] was performed, except that 68.0 parts of 2,6-di(trifluoromethoxy) cyclohexanone were used in place of 25.1 parts of cyclohexanone used in the production of the near-infrared absorbing dye [A-1], and 100.5 parts (yield: 93%) of a near-infrared absorbing dye [A-18] were obtained. As a result of mass spectrometry by TOF-MS, the near infrared absorbing dye [A-18] was identified.

Near-Infrared Absorbing Dye [A-18]

[Chemical Formula 22]

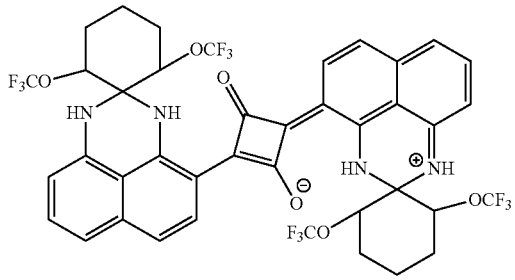

(Production of Near-Infrared Absorbing Dye [A-19])

The same process as in the production of the near-infrared absorbing dye [A-1] was performed, except that 48.6 parts of 4-phenoxycyclohexanone were used in place of 25.1 parts of cyclohexanone used in the production of the near-infrared absorbing dye [A-1], and 82.5 parts (yield: 92%) of a near-infrared absorbing dye [A-19] were obtained. As a result of mass spectrometry by TOF-MS, the near infrared absorbing dye [A-19] was identified.

Near-Infrared Absorbing Dye [A-19]

[Chemical Formula 23]

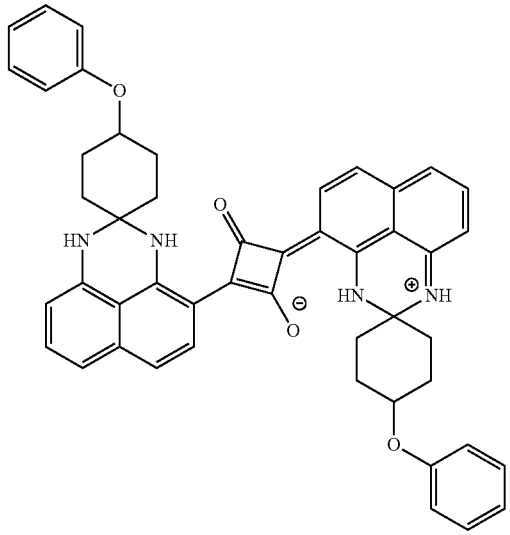

(Production of Near-Infrared Absorbing Dye [A-20])

The same process as in the production of the near-infrared absorbing dye [A-1] was performed, except that 51.1 parts of 3-oxo-cyclohexanesulfonic acid sodium salt were used in place of 25.1 parts of cyclohexanone used in the production of the near-infrared absorbing dye [A-1], and 83.3 parts (yield: 96%) of a near-infrared absorbing dye [A-20] were obtained. As a result of mass spectrometry by TOF-MS, the near infrared absorbing dye [A-20] was identified.

Near-Infrared Absorbing Dye [A-20]

[Chemical Formula 24]

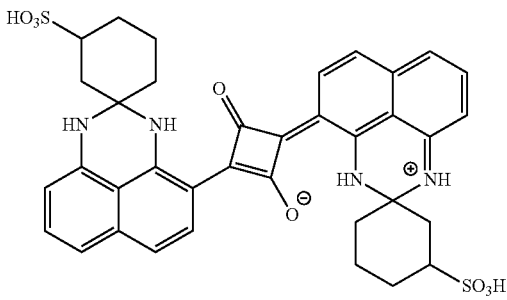

(Production of Near-Infrared Absorbing Dye [A-21])

The same process as in the production of the near-infrared absorbing dye [A-1] was performed, except that 52.4 parts of N-ethyl-3-oxocyclohexane-1-sulfonamide were used in place of 25.1 parts of cyclohexanone used in the production of the near-infrared absorbing dye [A-1], and 87.7 parts (yield: 94%) of a near-infrared absorbing dye [A-21] were obtained. As a result of mass spectrometry by TOF-MS, the near infrared absorbing dye [A-21] was identified.

Near-Infrared Absorbing Dye [A-21]

[Chemical Formula 25]

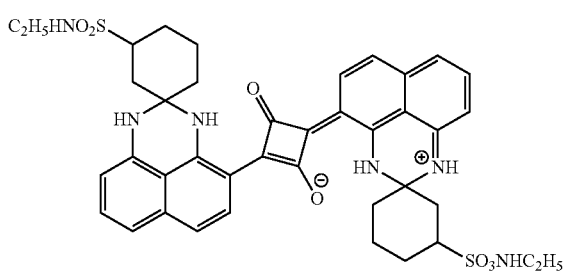

(Production of Near-Infrared Absorbing Dye [A-22])

The same process as in the production of the near-infrared absorbing dye [A-1] was performed, except that 36.3 parts of 4-oxocyclohexane carboxylic acid were used in place of 25.1 parts of cyclohexanone used in the production of the near-infrared absorbing dye [A-1], and 71.0 parts (yield: 91%) of a near-infrared absorbing dye [A-22] were obtained. As a result of mass spectrometry by TOF-MS, the near infrared absorbing dye [A-22] was identified.

Near-Infrared Absorbing Dye [A-22]

[Chemical Formula 26]

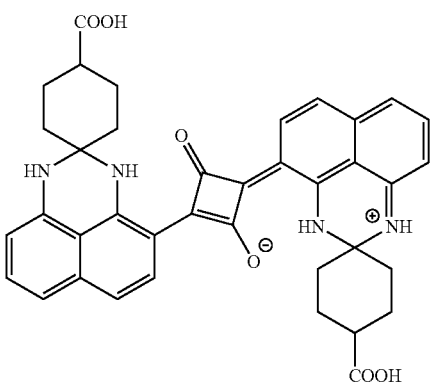

(Production of Near-Infrared Absorbing Dye [A-23])

The same process as in the production of the near-infrared absorbing dye [A-1] was performed, except that 43.5 parts of ethyl 2-oxocyclohexanecarboxylate were used in place of 25.1 parts of cyclohexanone used in the production of the near-infrared absorbing dye[A-1], and 78.9 parts (yield: 93%) of a near-infrared absorbing dye [A-23] were obtained. As a result of mass spectrometry by TOF-MS, the near infrared absorbing dye [A-23] was identified.

Near-Infrared Absorbing Dye [A-23]

[Chemical Formula 27]

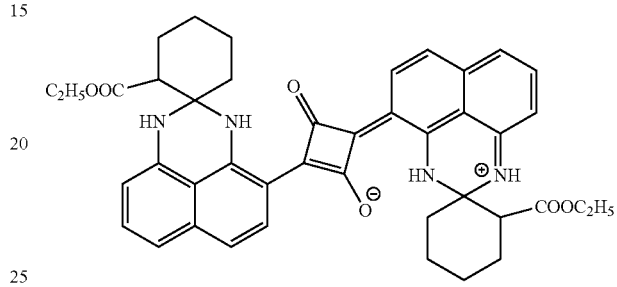

(Production of Near-Infrared Absorbing Dye [A-24])

The same process as in the production of the near-infrared absorbing dye [A-1] was performed, except that 46.8 parts of 4-oxo-N-propylcyclohexanecarboxamide were used in place of 25.1 parts of cyclohexanone used in the production of the near-infrared absorbing dye [A-1], and 87.1 parts (yield: 990) of a near-infrared absorbing dye [A-24] were obtained. As a result of mass spectrometry by TOF-MS, the near infrared absorbing dye [A-24] was identified.

Near Infrared Absorbing Dye [A-24]

[Chemical Formula 28]

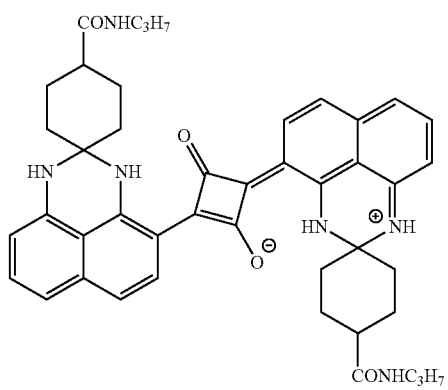

(Production of Near-Infrared Absorbing Dye [A-25])

The same process as in the production of the near-infrared absorbing dye [A-1] was performed, except that 28.9 parts of 4-aminocyclohexanone were used in place of 25.1 parts of cyclohexanone used in the production of near-infrared absorbing dye [A-1], and 68.1 parts (yield: 96%) of a near-infrared absorbing dye [A-25] were obtained. As a result of mass spectrometry by TOF-MS, the near infrared absorbing dye [A-25] was identified.

Near Infrared Absorbing Dye [A-25]

[Chemical Formula 29]

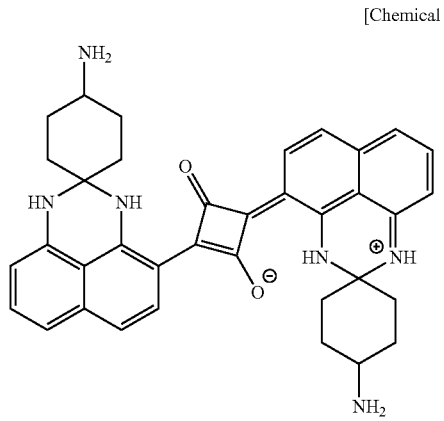

Near-Infrared Absorbing Dye [A-27]

[Chemical Formula 31]

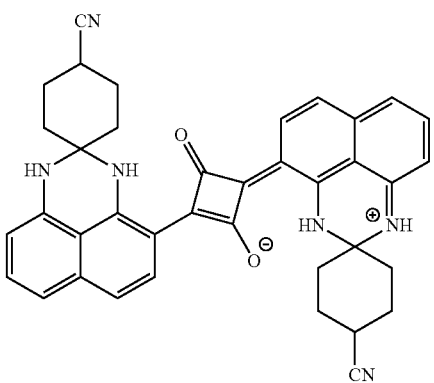

(Production of Near-Infrared Absorbing Dye [A-26])

The same process as in the production of the near-infrared absorbing dye [A-1] was performed, except that 36.1 parts of 4-(dimethylamino) cyclohexanone were used in place of 25.1 parts of cyclohexanone used in the production of the near-infrared absorbing dye [A-1], and 73.9 parts (yield: 95%) of a near-infrared absorbing dye [A-26] were obtained. As a result of mass spectrometry by TOF-MS, the near infrared absorbing dye [A-26] was identified.

Near-Infrared Absorbing Dye [A-26]

[Chemical Formula 30]

(Production of Near-Infrared Absorbing Dye [A-28])

The same process as in the production of the near-infrared absorbing dye [A-1] was performed, except that 36.6 parts of 4-nitrocyclohexanone were used in place of 25.1 parts of cyclohexanone used in the production of the near-infrared absorbing dye [A-1], and 72.0 parts (yield: 92%) of a near-infrared absorbing dye [A-28] were obtained. As a result of mass spectrometry by TOF-MS, the near-infrared absorbing dye [A-28] was identified.

Near-Infrared Absorbing Dye [A-28]

[Chemical Formula 32]

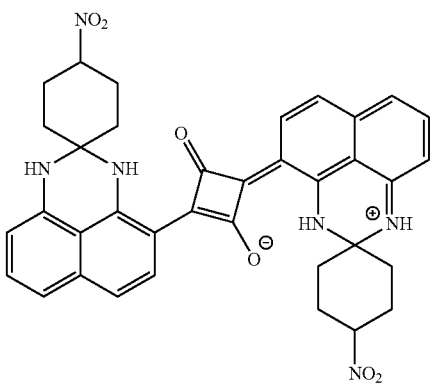

(Production of Near Infrared Absorbing Dye [A-27])

The same process as in the production of the near-infrared absorbing dye [A-1] was performed, except that 31.4 parts of 4-oxocyclohexanecarbonitrile were used in place of 25.1 parts of cyclohexanone used in the production of the near-infrared absorbing dye [A-1], and 67.5 parts (yield: 92%) of a near-infrared absorbing dye [A-27] were obtained. As a result of mass spectrometry by TOF-MS, the near-infrared absorbing dye [A-27] was identified.

(Production of Near-Infrared Absorbing Dye [A-29])

The same process as in the production of the near-infrared absorbing dye [A-1] was performed, except that 34.3 parts of 3,5-difluorocyclohexanone were used in place of 25.1 parts of cyclohexanone used in the production of the near-infrared absorbing dye [A-1], and 70.7 parts (yield: 93%) of a near infrared absorptive dye [A-29] were obtained. As a result of mass spectrometry by TOF-MS, the near-infrared absorbing dye [A-29] was identified.

Near-Infrared Absorbing Dye [A-29]

[Chemical Formula 33]

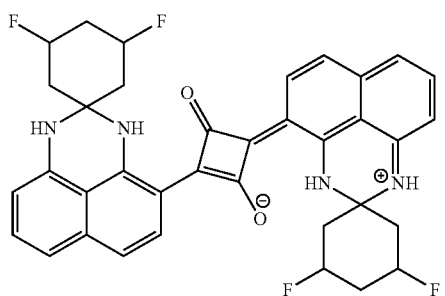

(Production of Near-Infrared Absorbing Dye [A-30])

The same process as in the production of the near-infrared absorbing dye [A-1] was performed, except that 33.9 parts of 2-chlorocyclohexanone were used in place of 25.1 parts of cyclohexanone used in the production of near-infrared absorbing dye [A-1], and 71.1 parts (yield: 94%) of a near-infrared absorbing dye [A-30] were obtained. As a result of mass spectrometry by TOF-MS, the near-infrared absorbing dye [A-30] was identified.

Near-Infrared Absorbing Dye [A-30]

[Chemical Formula 34]

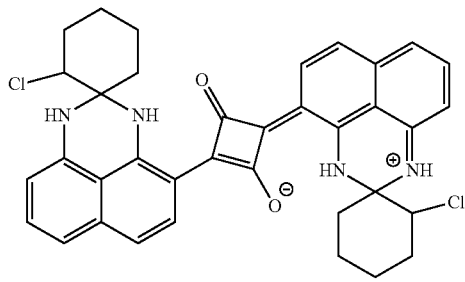

(Production of Near-Infrared Absorbing Dye [A-31])

The same process as in the production of the near-infrared absorbing dye [A-1] was performed, except that 65.4 parts of 3,3-dibromocyclohexanone was used in place of 25.1 parts of cyclohexanone used in the production of the near-infrared absorbing dye [A-1], and 99.3 parts (yield: 94%) of near-infrared absorbing dye [A-31] were obtained. As a result of mass spectrometry by TOF-MS, the near-infrared absorbing dye [A-31] was identified.

Near-Infrared Absorbing Dye [A-31]

[Chemical Formula 35]

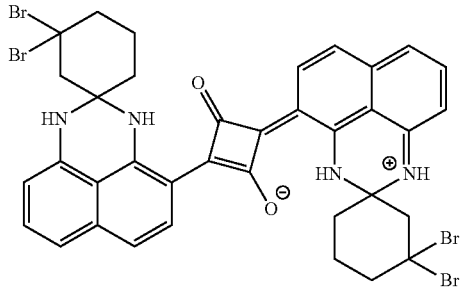

<Method for Producing Binder Resin [C]>

(Binder Resin Solution 1): Random Copolymer 70.0 parts of cyclohexanone were charged in a reaction container of a separable four-necked flask equipped with a thermometer, a condenser tube, a nitrogen gas inlet tube and a stirrer, and heated to 80° C., and the inside of the reaction container were subjected to nitrogen substitution. Thereafter, a mixture of 12.4 parts of n-butyl methacrylate, 4.6 parts of 2-hydroxyethyl methacrylate, 4.3 parts of methacrylic acid, 7.3 parts of paracumyl phenol ethylene oxide modified acrylate ("Aronix M110" produced by Toagosei Co., Ltd.) (the weight ratio of n-butyl methacrylate/2-hydroxyethyl methacrylate/methacrylic acid/paracumyl phenol ethylene oxide modified acrylate: 10.5/15.5/17.1/25.0) and 0.7 parts of 2,2'-azobisisobutyronitrile was dropped from a dropping tube over 2 hours. After completion of the dropping, the reaction was further continued for 3 hours to obtain a solution of an acrylic resin having an acid value of 110 mg KOH/g and a weight average molecular weight (Mw) of 10,000. After the solution was cooled to room temperature, about 2 g of the resin solution was sampled and heated and dried at 180° C. for 20 minutes to measure a nonvolatile content. Then, propylene glycol monoethyl ether acetate was added to the resin solution previously synthesized such that the nonvolatile content is 20% by weight, thereby preparing a binder resin solution 1.

(Binder Resin Solution 2)

Using the same method as in the production of the binder resin solution 1 except that the weight ratio of n-butyl methacrylate/2-hydroxyethyl methacrylate/methacrylic acid/paracumyl phenol ethylene oxide modified acrylate was changed to 10.5/15.5/49.0/25.0, a binder resin solution 2 having an acid value of 310 mg KOH/g and a weight average molecular weight (Mw) of 10,000 was obtained.

(Binder Resin Solution 3)

Using the same method as in the production of the binder resin solution 1 except that the weight ratio of n-butyl methacrylate/2-hydroxyethyl methacrylate/methacrylic acid/paracumyl phenol ethylene oxide modified acrylate was changed to 45.5/15.5/14.0/25.0, a binder resin solution 3 having an acid value of 120 mg KOH/g and a weight average molecular weight (Mw) of 10,000 was obtained.

(Binder Resin Solution 4)

Using the same method as in the production of the binder resin solution 1 except that the weight of 2,2'-azobisisobutyronitrile was changed to 0.50 parts, a binder resin solution 4 having an acid value of 110 mg KOH/g and a weight average molecular weight (Mw) of 35,000 was obtained.

(Binder Resin Solution 5)

Using the same method as in the production of the binder resin solution 1 except that the weight of 2,2'-azobisisobutyronitrile was changed to 0.8 parts, a binder resin solution 5 having an acid value of 110 mg KOH/g and a weight average molecular weight (Mw) of 6,000 was obtained.

(Binder Resin Solution 6)

Using the same method as in the production of the binder resin solution 1 except that the weight of 2,2'-azobisisobutyronitrile was changed to 0.06 parts, a binder resin solution 6 having an acid value of 94 mg KOH/g and a weight average molecular weight (Mw) of 112,000 was obtained.

(Binder Resin Solution 7)

Using the same method as in the production of the binder resin solution 1 except that the weight of 2,2'-azobisisobutyronitrile was changed to 1.23 parts, a binder resin solution 7 having an acid value of 110 mg KOH/g and a weight average molecular weight (Mw) of 4,000 was obtained.

(Binder Resin Solution 8)

333 g of propylene glycol monomethyl ether acetate was introduced into a flask equipped with a stirrer, a thermometer, a reflux condenser, a dropping funnel and a nitrogen inlet tube, and the atmosphere in the flask was changed from air to nitrogen and then heated to 100° C. Thereafter, 3.6 g of azobisisobutyronitrile was added to a mixture of 70.5 g (0.40 mol) of benzyl methacrylate, 71.1 g (0.50 mol) of glycidyl methacrylate, 22.0 g (0.10 mol) of monomethacrylate of a tricyclodecane skeleton (FA-513M produced by Hitachi Chemical Co., Ltd), and 164 g of propylene glycol monomethyl ether acetate, and the resultant solution was dropped into the flask from the dropping funnel over 2 hours and continuously stirred at 100° C. for 5 hours. Next, the atmosphere in the flask was changed from nitrogen to air, 43.0 g of methacrylic acid [0.5 mol, (100 mol % with respect to the glycidyl group of glycidyl methacrylate used in this reaction)], 0.9 g of trisdimethylaminomethylphenol and 0.145 g of hydroquinone were put into the flask and the reaction was continued at 110° C. for 6 hours to complete the reaction when the solid content acid value reached 1 mg KOH/g. Next, 60.9 g (0.40 mol) of tetrahydrophthalic phthalic anhydride and 0.8 g of triethylamine were added and reacted at 120° C. for 3.5 hours to obtain a binder resin solution 8 having a solid content acid value of 80 mg KOH/g. The weight average molecular weight (Mw) was 12,000, and the molecular weight distribution (Mw/Mn) was 2.1.

(Binder Resin Solution 9)

182 g of propylene glycol monomethyl ether acetate was introduced into a flask equipped with a stirrer, a thermometer, a reflux condenser, a dropping funnel and a nitrogen inlet tube, and the atmosphere in the flask was changed from air to nitrogen and then heated to 100° C. Thereafter, 3.6 g of azobisisobutyronitrile was added to a mixture of 70.5 g (0.40 mol) of benzyl methacrylate, 43.0 g (0.5 mol) of methacrylic acid, 22.0 g (0.10 mol) of monomethacrylate of a tricyclodecane skeleton (FA-513M produced by Hitachi Chemical Co., Ltd), and 136 g of propylene glycol monomethyl ether acetate, and the resultant solution was dropped into the flask from the dropping funnel over 2 hours and continuously stirred at 100° C. for 5 hours. Next, the atmosphere in the flask was changed from nitrogen to air, 35.5 g of glycidyl methacrylate [0.25 mol, (50 mol % with respect to the carboxyl group of methacrylic acid used in this reaction)], 0.9 g of trisdimethylaminomethylphenol and 0.145 g of hydroquinone were put into the flask and the reaction was continued at 110° C. for 6 hours to obtain a binder resin solution 9 having a solid content acid value of 79 mg KOH/g. The weight average molecular weight (Mw) was 13,000, and the molecular weight distribution (Mw/Mn) was 2.1.

(Binder Resin Solution 10)

Using the same method as in the production of the binder resin solution 1 except that the weight ratio of n-butyl methacrylate/2-hydroxyethyl methacrylate/methacrylic acid/paracumyl phenol ethylene oxide modified acrylate was changed to 57.9/0.0/17.1/25.0, a binder resin solution 10 having an acid value of 110 mg KOH/g and a weight average molecular weight (Mw) of 10,000 was obtained.

<Method for Producing Resin-Based Dispersant [B1]>

(Resin-Based Dispersant 1 Solution): Graft Copolymer 150 parts of PGMAc and 100 parts of n-butyl methacrylate were charged in a reaction container equipped with a gas inlet tube, a thermometer, a condenser, and a stirrer, and substituted with nitrogen gas. The inside of the reaction container was heated to 80° C., and a solution of 0.5 parts of 2,2'-azobisisobutyronitrile dissolved in 4 parts of 2-mercaptoethanol was added and reacted for 10 hours. It was confirmed that the reaction was 95% completed by the solid content measurement, and a reaction product (dispersant 1a) having a number average molecular weight of 3900 and a weight average molecular weight of 7900 was obtained.

7.9 parts of 2-methacryloyloxyethyl isocyanate, 0.05 parts of methyl dibutyl tin dilaurate and 0.05 parts of methyl hydroquinone were additionally charged in the above reaction product, and the reaction container was heated to 100° C. and reacted for four hours. Thereafter, the reaction container was cooled to 40° C. to obtain a reaction product (resin-based dispersant 1b solution).

122 parts of PGMAc was charged in a reaction tank equipped with a gas inlet tube, a condenser, a stirring blade, and a thermometer, and heated to 100° C. while nitrogen substitution was performed. The reaction product mentioned above, together with 150 parts of pentamethylpiperidyl methacrylate (Adekastab LA-82, produced by ADEKA CORPORATION), 10 parts of hydroxyethyl methacrylate, and 4 parts of 2,2'-azobis (2,4-dimethylbutyronitrile) were charged in a dropping tank, stirred to be uniform, dropped into the reaction tank over 2 hours, and then the reaction was continued at the same temperature for 3 hours. In this way, a resin-based dispersant 1 solution of a poly (meth)acrylate skeleton having an amine value per solid content of 42 mg KOH/g, a weight average molecular weight (Mw) of 23,500, and a nonvolatile content of 40% by weight, and having a tertiary amino group was obtained.

(Resin-Based Dispersant 2 Solution): Block Copolymer 60 parts of methyl methacrylate, 20 parts of n-butyl methacrylate, and 13.2 parts of tetramethylethylenediamine were charged in a reaction apparatus equipped with a gas inlet tube, a condenser, a stirring blade, and a thermometer, and stirred at 50° C. for an hour while nitrogen was flowing, and the inside of the system was subjected to nitrogen substitution. Next, 9.3 parts of ethyl bromoisobutyrate, 5.6 parts of cuprous chloride, and 133 parts of PGMAc were charged, and heated to 110° C. under a nitrogen stream to start polymerization of a first block. After polymerization for four hours, the polymerization solution was sampled and the solid content was measured, and it was confirmed that the polymerization conversion rate was 98% or more in terms of nonvolatile content.

Next, 61 parts of PGMAc and 20 parts of dimethylaminoethyl methacrylate (hereinafter referred to as DM) as a second block monomer were charged into this reaction apparatus, and stirred at 110° C. while keeping the nitrogen atmosphere, and the reaction was continued. After two hours from the introduction of dimethylaminoethyl methacrylate, the polymerization solution was sampled and the solid content was measured. It was confirmed that the polymerization conversion rate of the second block was 98% or more in terms of nonvolatile content. Then, the reaction solution was cooled to room temperature and the polymerization was stopped.

Propylene glycol monomethyl ether acetate was added to the previously synthesized block copolymer solution so that the nonvolatile content became 40% by weight. In this way, a resin-based dispersant 2 solution of a poly (meth)acrylate skeleton having an amine value per solid content of 71.4 mg KOH/g, a weight average molecular weight (Mw) of 9900, and a nonvolatile content of 40% by weight, and having a tertiary amino group was obtained.

(Resin-Based Dispersant 3 Solution): Block Copolymer 60 parts of methyl methacrylate, 20 parts of n-butyl methacrylate, and 13.2 parts of tetramethylethylenediamine were charged in a reaction apparatus equipped with a gas inlet tube, a condenser, a stirring blade, and a thermometer, and stirred at 50° C. for an hour while nitrogen was flowing, and the inside of the system was subjected to nitrogen substitution. Next, 9.3 parts of ethyl bromoisobutyrate, 5.6 parts of cuprous chloride, and 133 parts of PGMAc were charged, and heated to 110° C. under a nitrogen stream to start polymerization of a first block. After polymerization for four hours, the polymerization solution was sampled and the solid content was measured, and it was confirmed that the polymerization conversion rate was 98% or more in terms of nonvolatile content.

Next, 61 parts of PGMAc and 25.6 parts of methacryloyloxyethyltrimethylammonium chloride aqueous solution ("ACRYESTER DMC 78" produced by Mitsubishi Rayon Co., Ltd.) as a second block monomer were charged into this reaction apparatus, and stirred at 110° C. while maintaining the nitrogen atmosphere, and the reaction was continued. After two hours from the introduction of methacryloyloxyethyltrimethylammonium chloride, the polymerization solution was sampled and the solid content was measured. It was confirmed that the polymerization conversion rate of the second block was 98% or more in terms of nonvolatile content. Then, the reaction solution was cooled to room temperature and the polymerization was stopped.

Propylene glycol monomethyl ether acetate was added to the previously synthesized block copolymer solution so that the nonvolatile content became 40% by weight. In this way, a resin-based dispersant 3 solution of a poly (meth)acrylate skeleton having an amine value per solid content of 2 mg KOH/g, a weight average molecular weight (Mw) of 9800, and a nonvolatile content of 40% by weight, and having a quaternary ammonium salt group was obtained.

(Resin-Based Dispersant 4 Solution)

In a reaction apparatus equipped with a gas inlet tube, a condenser, a stirring blade and a thermometer, 20.6 g of dimethylaminoethyl methacrylate, 215 mg of 2,2'-azobisisobutyronitrile and 528 mg of pyrazole-1-dithiocarboxylic acid cyano (dimethyl) methyl ester were dissolved in 30 mL of toluene, and nitrogen bubbling was carried out for 1 hour. Thereafter, the reaction solution was gently stirred and heated to 60° C., and this temperature was maintained for 24 hours to perform living radical polymerization.

Then, 474 mg of 2,2'-azobisisobutyronitrile, 2.2 g of n-butyl methacrylate, 2.8 g of methoxy polyethylene glycol monomethacrylate (PME-200: produced by NOF Corporation), and 2.2 g of tetrahydrofurfuryl methacrylate were dissolved in 20 mL of toluene and subjected to nitrogen substitution for 30 minutes. The solution was added to the above reaction solution, and living radical polymerization was carried out at 60° C. for 24 hours. Thereafter, the solution was adjusted to a solution of PGMAc of 40% by mass by vacuum concentration. In this way, a resin-based dispersant 4 solution was obtained, which is a block copolymer including an A block having a repeating unit derived from dimethylaminoethyl methacrylate and a B block having a repeating unit derived from n-butyl methacrylate, methoxypolyethylene glycol monomethacrylate and tetrahydrofurfuryl methacrylate. The obtained resin-based dispersant 4 had an amine value of 30 mg KOH/g.

(Resin-Based Dispersant 5 Solution)

In the same method as in the production of the resin-based dispersant solution 4, the weight ratio of n-butyl methacrylate/tetrahydrofurfuryl methacrylate/methoxypolyethylene glycol monomethacrylate/dimethylaminoethyl methacrylate was set to 32/8/10/50, thereby obtaining a resin-based dispersant 5 solution having an amine value of 180 mg KOH/g.

(Resin-Based Dispersant 6 Solution)

Disperbyk-130 (produced by BYK Japan K.K.: nonvolatile content: 51%, amine value: 190)

(Resin-Based Dispersant 7 Solution)

Disperbyk-145 (produced by BYK Japan K.K.: nonvolatile content: 95%, amine value: 71)

(Resin-Based Dispersant 8 Solution)

Disperbyk-180 (produced by BYK Japan K.K.: nonvolatile content: 81%, amine value: 94)

(Resin-Based Dispersant 9 Solution)

Disperbyk-2001 (produced by BYK Japan K.K., nonvolatile content: 46%, amine value: 29)

(Resin-Based Dispersant 10 Solution): Block Copolymer 60 parts of methyl methacrylate, 20 parts of n-butyl methacrylate, and 13.2 parts of tetramethylethylenediamine were charged in a reaction apparatus equipped with a gas inlet tube, a condenser, a stirring blade, and a thermometer, and stirred at 50° C. for an hour while nitrogen was flowing, and the inside of the system was subjected to nitrogen substitution. Next, 9.3 parts of ethyl bromoisobutyrate, 5.6 parts of cuprous chloride, and 133 parts of PGMAc were charged, and heated to 110° C. under a nitrogen stream to start polymerization of a first block. After polymerization for four hours, the polymerization solution was sampled and the solid content was measured, and it was confirmed that the polymerization conversion rate was 980 or more in terms of nonvolatile content.

Next, 61 parts of PGMAc, 12.8 parts of methacryloyloxyethyltrimethylammonium chloride aqueous solution ("ACRYESTER DMC 78" produced by Mitsubishi Rayon Co., Ltd.) as a second block monomer, and 10 parts of dimethylaminoethyl methacrylate were charged into this reaction apparatus, and stirred at 110° C. while maintaining the nitrogen atmosphere, and the reaction was continued. After two hours from the introduction of methacryloyloxyethyltrimethylammonium chloride, the polymerization solution was sampled and the solid content was measured. It was confirmed that the polymerization conversion rate of the second block was 980 or more in terms of nonvolatile content. Then, the reaction solution was cooled to room temperature and the polymerization was stopped.

Propylene glycol monomethyl ether acetate was added to the previously synthesized block copolymer solution so that the nonvolatile content became 40% by weight. In this way, a resin-based dispersant 10 solution of a poly (meth)acrylate skeleton having an amine value per solid content of 36 mg KOH/g, a weight average molecular weight (Mw) of 9700, and a nonvolatile content of 40% by weight, and having a tertiary amino group and a quaternary ammonium salt group was obtained.

<Production of Near-Infrared Absorbing Composition Dispersion>

(Near-Infrared Absorbing Composition Dispersion (D-1))

After a mixture having the following composition was uniformly stirred and mixed, it was dispersed for three hours with an eiger mill using zirconia beads having a diameter of 0.5 mm, and then filtered with a 0.5 μm filter to prepare a near-infrared absorbing composition.

Near-infrared absorbing dye [A-1]: 10.0 parts
Resin-based dispersant 2 solution: 7.5 parts
Binder-resin solution 1: 35.0 parts
Propylene glycol monomethyl ether acetate: 47.5 parts (Near-Infrared Absorbing Composition Dispersion (D-2 to D-63))

In the same manner as in the production of the near-infrared absorbing composition dispersion (D-1) except that the near-infrared absorbing dye, the resin-based dispersant solution, the binder resin solution, and the solvent were changed to the compositions and amounts shown in Table 1, near-infrared absorbing composition dispersions (D-2 to D-63) were prepared.

TABLE 1

| Near-infrared absorbing composition dispersion | Near-infrared absorbing dye [A] | | Resin-based dispersant | | Binder resin solution | | Organic solvent PGMAc |
|---|---|---|---|---|---|---|---|
| | Type | Amount | Type | Amount | Type | Amount | Amount |
| D-1 | A-1 | 10 parts | Resin-based dispersant 2 solution | 7.5 parts | Binder resin solution 1 | 35.0 parts | 47.5 parts |
| D-2 | A-2 | 10 parts | Resin-based dispersant 2 solution | 7.5 parts | Binder resin solution 1 | 35.0 parts | 47.5 parts |
| D-3 | A-3 | 10 parts | Resin-based dispersant 1 solution | 7.5 parts | Binder resin solution 1 | 35.0 parts | 47.5 parts |
| D-4 | A-3 | 10 parts | Resin-based dispersant 2 solution | 7.5 parts | Binder resin solution 1 | 35.0 parts | 47.5 parts |
| D-5 | A-3 | 10 parts | Resin-based dispersant 3 solution | 7.5 parts | Binder resin solution 1 | 35.0 parts | 47.5 parts |
| D-6 | A-3 | 10 parts | Resin-based dispersant 4 solution | 7.5 parts | Binder resin solution 1 | 35.0 parts | 47.5 parts |
| D-7 | A-3 | 10 parts | Resin-based dispersant 5 solution | 7.5 parts | Binder resin solution 1 | 35.0 parts | 47.5 parts |
| D-8 | A-3 | 10 parts | Resin-based dispersant 6 solution | 5.9 parts | Binder resin solution 1 | 35.0 parts | 49.1 parts |
| D-9 | A-3 | 10 parts | Resin-based dispersant 7 solution | 3.2 parts | Binder resin solution 1 | 35.0 parts | 51.8 parts |
| D-10 | A-3 | 10 parts | Resin-based dispersant 8 solution | 3.7 parts | Binder resin solution 1 | 35.0 parts | 51.3 parts |
| D-11 | A-3 | 10 parts | Resin-based dispersant 9 solution | 6.5 parts | Binder resin solution 1 | 35.0 parts | 48.5 parts |
| D-12 | A-4 | 10 parts | Resin-based dispersant 2 solution | 7.5 parts | Binder resin solution 1 | 35.0 parts | 47.5 parts |
| D-13 | A-5 | 10 parts | Resin-based dispersant 1 solution | 7.5 parts | Binder resin solution 1 | 35.0 parts | 47.5 parts |
| D-14 | A-5 | 10 parts | Resin-based dispersant 2 solution | 7.5 parts | Binder resin solution 1 | 35.0 parts | 47.5 parts |
| D-15 | A-5 | 10 parts | Resin-based dispersant 3 solution | 7.5 parts | Binder resin solution 1 | 35.0 parts | 47.5 parts |
| D-16 | A-5 | 10 parts | Resin-based dispersant 4 solution | 7.5 parts | Binder resin solution 1 | 35.0 parts | 47.5 parts |
| D-17 | A-5 | 10 parts | Resin-based dispersant 5 solution | 7.5 parts | Binder resin solution 1 | 35.0 parts | 47.5 parts |
| D-18 | A-5 | 10 parts | Resin-based dispersant 6 solution | 5.9 parts | Binder resin solution 1 | 35.0 parts | 49.1 parts |
| D-19 | A-5 | 10 parts | Resin-based dispersant 7 solution | 3.2 parts | Binder resin solution 1 | 35.0 parts | 51.8 parts |
| D-20 | A-5 | 10 parts | Resin-based dispersant 8 solution | 3.7 parts | Binder resin solution 1 | 35.0 parts | 51.3 parts |
| D-21 | A-5 | 10 parts | Resin-based dispersant 9 solution | 6.5 parts | Binder resin solution 1 | 35.0 parts | 48.5 parts |
| D-22 | A-6 | 10 parts | Resin-based dispersant 2 solution | 7.5 parts | Binder resin solution 1 | 35.0 parts | 47.5 parts |
| D-23 | A-7 | 10 parts | Resin-based dispersant 2 solution | 7.5 parts | Binder resin solution 1 | 35.0 parts | 47.5 parts |
| D-24 | A-8 | 10 parts | Resin-based dispersant 2 solution | 7.5 parts | Binder resin solution 1 | 35.0 parts | 47.5 parts |
| D-25 | A-9 | 10 parts | Resin-based dispersant 2 solution | 7.5 parts | Binder resin solution 1 | 35.0 parts | 47.5 parts |
| D-26 | A-10 | 10 parts | Resin-based dispersant 2 solution | 7.5 parts | Binder resin solution 1 | 35.0 parts | 47.5 parts |
| D-27 | A-11 | 10 parts | Resin-based dispersant 2 solution | 7.5 parts | Binder resin solution 1 | 35.0 parts | 47.5 parts |
| D-28 | A-12 | 10 parts | Resin-based dispersant 2 solution | 7.5 parts | Binder resin solution 1 | 35.0 parts | 47.5 parts |
| D-29 | A-13 | 10 parts | Resin-based dispersant 2 solution | 7.5 parts | Binder resin solution 1 | 35.0 parts | 47.5 parts |
| D-30 | A-14 | 10 parts | Resin-based dispersant 2 solution | 7.5 parts | Binder resin solution 1 | 35.0 parts | 47.5 parts |
| D-31 | A-15 | 10 parts | Resin-based dispersant 2 solution | 7.5 parts | Binder resin solution 1 | 35.0 parts | 47.5 parts |
| D-32 | A-16 | 10 parts | Resin-based dispersant 2 solution | 7.5 parts | Binder resin solution 1 | 35.0 parts | 47.5 parts |
| D-33 | A-17 | 10 parts | Resin-based dispersant 2 solution | 7.5 parts | Binder resin solution 1 | 35.0 parts | 47.5 parts |
| D-34 | A-18 | 10 parts | Resin-based dispersant 2 solution | 7.5 parts | Binder resin solution 1 | 35.0 parts | 47.5 parts |
| D-35 | A-19 | 10 parts | Resin-based dispersant 2 solution | 7.5 parts | Binder resin solution 1 | 35.0 parts | 47.5 parts |
| D-36 | A-20 | 10 parts | Resin-based dispersant 2 solution | 7.5 parts | Binder resin solution 1 | 35.0 parts | 47.5 parts |
| D-37 | A-21 | 10 parts | Resin-based dispersant 2 solution | 7.5 parts | Binder resin solution 1 | 35.0 parts | 47.5 parts |
| D-38 | A-22 | 10 parts | Resin-based dispersant 2 solution | 7.5 parts | Binder resin solution 1 | 35.0 parts | 47.5 parts |
| D-39 | A-23 | 10 parts | Resin-based dispersant 2 solution | 7.5 parts | Binder resin solution 1 | 35.0 parts | 47.5 parts |
| D-40 | A-24 | 10 parts | Resin-based dispersant 2 solution | 7.5 parts | Binder resin solution 1 | 35.0 parts | 47.5 parts |
| D-41 | A-25 | 10 parts | Resin-based dispersant 2 solution | 7.5 parts | Binder resin solution 1 | 35.0 parts | 47.5 parts |
| D-42 | A-26 | 10 parts | Resin-based dispersant 2 solution | 7.5 parts | Binder resin solution 1 | 35.0 parts | 47.5 parts |
| D-43 | A-27 | 10 parts | Resin-based dispersant 2 solution | 7.5 parts | Binder resin solution 1 | 35.0 parts | 47.5 parts |
| D-44 | A-28 | 10 parts | Resin-based dispersant 2 solution | 7.5 parts | Binder resin solution 1 | 35.0 parts | 47.5 parts |
| D-45 | A-29 | 10 parts | Resin-based dispersant 2 solution | 7.5 parts | Binder resin solution 1 | 35.0 parts | 47.5 parts |
| D-46 | A-30 | 10 parts | Resin-based dispersant 2 solution | 7.5 parts | Binder resin solution 1 | 35.0 parts | 47.5 parts |
| D-47 | A-31 | 10 parts | Resin-based dispersant 2 solution | 7.5 parts | Binder resin solution 1 | 35.0 parts | 47.5 parts |
| D-48 | A-3 | 10 parts | Resin-based dispersant 1 solution | 7.5 parts | Binder resin solution 3 | 35.0 parts | 47.5 parts |
| D-49 | A-3 | 10 parts | Resin-based dispersant 1 solution | 7.5 parts | Binder resin solution 4 | 35.0 parts | 47.5 parts |
| D-50 | A-3 | 10 parts | Resin-based dispersant 1 solution | 7.5 parts | Binder resin solution 5 | 35.0 parts | 47.5 parts |
| D-51 | A-3 | 10 parts | Resin-based dispersant 1 solution | 7.5 parts | Binder resin solution 8 | 28.2 parts | 54.3 parts |
| D-52 | A-3 | 10 parts | Resin-based dispersant 1 solution | 7.5 parts | Binder resin solution 9 | 28.2 parts | 54.3 parts |
| D-53 | A-3 | 10 parts | Resin-based dispersant 2 solution | 7.5 parts | Binder resin solution 1 | 35.0 parts | 47.5 parts |
| D-54 | A-3 | 10 parts | Resin-based dispersant 1 solution | 7.5 parts | Binder resin solution 8 | 28.2 parts | 54.3 parts |
| D-55 | A-3 | 10 parts | Resin-based dispersant 1 solution | 7.5 parts | Binder resin solution 9 | 28.2 parts | 54.3 parts |
| D-56 | A-3 | 10 parts | Resin-based dispersant 2 solution | 7.5 parts | Binder resin solution 1 | 35.0 parts | 47.5 parts |
| D-62 | A-3 | 10 parts | Resin-based dispersant 1 solution | 7.5 parts | Binder resin solution 10 | 35.0 parts | 47.5 parts |
| D-63 | A-3 | 10 parts | Resin-based dispersant 10 solution | 7.5 parts | Binder resin solution 1 | 35.0 parts | 47.5 parts |
| D-57 | A-3 | 10 parts | Resin-based dispersant 1 solution | 7.5 parts | Binder resin solution 2 | 35.0 parts | 47.5 parts |
| D-58 | A-3 | 10 parts | Resin-based dispersant 1 solution | 7.5 parts | Binder resin solution 7 | 35.0 parts | 47.5 parts |
| D-59 | A-3 | 10 parts | Resin-based dispersant 1 solution | 7.5 parts | Binder resin solution 6 | 35.0 parts | 47.5 parts |
| D-60 | A-3 | 10 parts | — | — | Binder resin solution 1 | 50.0 parts | 40.0 parts |
| D-61 | A-5 | 10 parts | — | — | Binder resin solution 1 | 50.0 parts | 40.0 parts |

<Production of Photosensitive Near-Infrared Absorbing Composition>

Example 1

The following mixture was stirred and mixed so as to be uniform, and thereafter, the mixture was filtered through a 1.0 μm filter to obtain a photosensitive near-infrared absorbing composition (R-1).
Near-infrared absorbing composition (D-1): 30.0 parts
Binder resin solution 1: 13.9 parts
Photopolymerizable monomer ("ARONIX M-350" produced by Toagosei Co., Ltd.): 3.2 parts
Photopolymerization initiator ("OXE-01" produced by BASF): 0.2 parts
PGMAc: 52.7 parts

Example 5

The following mixture was stirred and mixed so as to be uniform, and thereafter, the mixture was filtered through a 1.0 μm filter to obtain a photosensitive near-infrared absorbing composition (R-5).
Near-infrared absorbing composition (D-5): 30.0 parts
Binder resin solution 1: 13.3 parts
Hindered phenol series antioxidant ("IRGANOX 1010" produced by BASF): 0.2 parts
Photopolymerizable monomer ("ARONIX M-350" produced by Toagosei Co., Ltd.): 3.2 parts
Photopolymerization initiator ("OXE-01" produced by BASF): 0.2 parts
PGMAc: 53.3 parts

Example 6

In the same manner as in the production of the photosensitive near-infrared absorbing composition (R-5), except that the near-infrared absorbing composition was changed to (D-6) and the hindered phenol series antioxidant ("IRGANOX 1010" produced by BASF Co.) was changed to epoxy resin ("EX-611" produced by Nagase Chemtex Corporation), a photosensitive near-infrared absorbing composition (R-6) was obtained.

Examples 2 to 4, and 7 to 63, and Comparative Examples 1 to 5

In the same manner as in the production of the photosensitive near-infrared absorbing composition (R-1), (R-5) or (R-6), except that the compositions and amounts were changed to those shown in Table 2, photosensitive near-infrared absorbing compositions (R-2 to R-4, and R-7 to R-68) were obtained.

TABLE 2

| | Photosensitive near-infrared absorbing composition | Near-infrared absorbing composition dispersion | | Binder resin solution | | Irganox 1010 |
|---|---|---|---|---|---|---|
| | | Type | Amount | Type | Amount | Amount |
| Ex. 1 | R-1 | D-1 | 30.0 parts | Binder resin solution 1 | 13.9 parts | |
| Ex. 2 | R-2 | D-2 | 30.0 parts | Binder resin solution 1 | 13.9 parts | |
| Ex. 3 | R-3 | D-3 | 30.0 parts | Binder resin solution 1 | 13.9 parts | |
| Ex. 4 | R-4 | D-4 | 30.0 parts | Binder resin solution 1 | 13.9 parts | |
| Ex. 5 | R-5 | D-5 | 30.0 parts | Binder resin solution 1 | 13.3 parts | 0.2 parts |
| Ex. 6 | R-6 | D-6 | 30.0 parts | Binder resin solution 1 | 13.3 parts | |
| Ex. 7 | R-7 | D-7 | 30.0 parts | Binder resin solution 1 | 13.9 parts | |
| Ex. 8 | R-8 | D-8 | 30.0 parts | Binder resin solution 1 | 13.9 parts | |
| Ex. 9 | R-9 | D-9 | 30.0 parts | Binder resin solution 1 | 13.9 parts | |
| Ex. 10 | R-10 | D-10 | 30.0 parts | Binder resin solution 1 | 13.9 parts | |
| Ex. 11 | R-11 | D-11 | 30.0 parts | Binder resin solution 1 | 13.3 parts | 0.2 parts |
| Ex. 12 | R-12 | D-12 | 30.0 parts | Binder resin solution 1 | 13.3 parts | |
| Ex. 13 | R-13 | D-13 | 30.0 parts | Binder resin solution 1 | 13.9 parts | |
| Ex. 14 | R-14 | D-14 | 30.0 parts | Binder resin solution 1 | 13.9 parts | |
| Ex. 15 | R-15 | D-15 | 30.0 parts | Binder resin solution 1 | 13.9 parts | |
| Ex. 16 | R-16 | D-16 | 30.0 parts | Binder resin solution 1 | 13.9 parts | |
| Ex. 17 | R-17 | D-17 | 30.0 parts | Binder resin solution 1 | 13.3 parts | 0.2 parts |
| Ex. 18 | R-18 | D-18 | 30.0 parts | Binder resin solution 1 | 13.3 parts | |
| Ex. 19 | R-19 | D-19 | 30.0 parts | Binder resin solution 1 | 13.9 parts | |
| Ex. 20 | R-20 | D-20 | 30.0 parts | Binder resin solution 1 | 13.9 parts | |
| Ex. 21 | R-21 | D-21 | 30.0 parts | Binder resin solution 1 | 13.9 parts | |
| Ex. 22 | R-22 | D-22 | 30.0 parts | Binder resin solution 1 | 13.9 parts | |
| Ex. 23 | R-23 | D-23 | 30.0 parts | Binder resin solution 1 | 13.3 parts | 0.2 parts |
| Ex. 24 | R-24 | D-24 | 30.0 parts | Binder resin solution 1 | 13.3 parts | |
| Ex. 25 | R-25 | D-25 | 30.0 parts | Binder resin solution 1 | 13.9 parts | |
| Ex. 26 | R-26 | D-26 | 30.0 parts | Binder resin solution 1 | 13.9 parts | |
| Ex. 27 | R-27 | D-27 | 30.0 parts | Binder resin solution 1 | 13.9 parts | |
| Ex. 28 | R-28 | D-28 | 30.0 parts | Binder resin solution 1 | 13.9 parts | |
| Ex. 29 | R-29 | D-29 | 30.0 parts | Binder resin solution 1 | 13.3 parts | 0.2 parts |
| Ex. 30 | R-30 | D-30 | 30.0 parts | Binder resin solution 1 | 13.3 parts | |
| Ex. 31 | R-31 | D-31 | 30.0 parts | Binder resin solution 1 | 13.9 parts | |
| Ex. 32 | R-32 | D-32 | 30.0 parts | Binder resin solution 1 | 13.9 parts | |
| Ex. 33 | R-33 | D-33 | 30.0 parts | Binder resin solution 1 | 13.9 parts | |
| Ex. 34 | R-34 | D-34 | 30.0 parts | Binder resin solution 1 | 13.9 parts | |
| Ex. 35 | R-35 | D-35 | 30.0 parts | Binder resin solution 1 | 13.3 parts | 0.2 parts |
| Ex. 36 | R-36 | D-36 | 30.0 parts | Binder resin solution 1 | 13.3 parts | |
| Ex. 37 | R-37 | D-37 | 30.0 parts | Binder resin solution 1 | 13.9 parts | |
| Ex. 38 | R-38 | D-38 | 30.0 parts | Binder resin solution 1 | 13.9 parts | |
| Ex. 39 | R-39 | D-39 | 30.0 parts | Binder resin solution 1 | 13.9 parts | |

TABLE 2-continued

| | | | | | | |
|---|---|---|---|---|---|---|
| Ex. 40 | R-40 | D-40 | 30.0 parts | Binder resin solution 1 | 13.9 parts | |
| Ex. 41 | R-41 | D-41 | 30.0 parts | Binder resin solution 1 | 13.3 parts | 0.2 parts |
| Ex. 42 | R-42 | D-42 | 30.0 parts | Binder resin solution 1 | 13.3 parts | |
| Ex. 43 | R-43 | D-43 | 30.0 parts | Binder resin solution 1 | 13.9 parts | |
| Ex. 44 | R-44 | D-44 | 30.0 parts | Binder resin solution 1 | 13.9 parts | |
| Ex. 45 | R-45 | D-45 | 30.0 parts | Binder resin solution 1 | 13.9 parts | |
| Ex. 46 | R-46 | D-46 | 30.0 parts | Binder resin solution 1 | 13.9 parts | |
| Ex. 47 | R-47 | D-47 | 30.0 parts | Binder resin solution 1 | 13.3 parts | 0.2 parts |
| Ex. 48 | R-48 | D-48 | 30.0 parts | Binder resin solution 3 | 13.9 parts | |
| Ex. 49 | R-49 | D-49 | 30.0 parts | Binder resin solution 4 | 13.9 parts | |
| Ex. 50 | R-50 | D-50 | 30.0 parts | Binder resin solution 5 | 13.9 parts | |
| Ex. 51 | R-51 | D-51 | 30.0 parts | Binder resin solution 8 | 15.7 parts | |
| Ex. 52 | R-52 | D-52 | 30.0 parts | Binder resin solution 9 | 15.7 parts | |
| Ex. 53 | R-53 | D-53 | 30.0 parts | Binder resin solution 1 | 13.9 parts | |
| Ex. 54 | R-54 | D-54 | 30.0 parts | Binder resin solution 8 | 25.4 parts | |
| Ex. 55 | R-55 | D-55 | 30.0 parts | Binder resin solution 9 | 25.4 parts | |
| Ex. 56 | R-56 | D-56 | 30.0 parts | Binder resin solution 1 | 22.5 parts | |
| Ex. 57 | R-62 | D-62 | 30.0 parts | Binder resin solution 10 | 15.7 parts | |
| Ex. 58 | R-63 | D-62 | 30.0 parts | Binder resin solution 10 | 22.5 parts | |
| Ex. 59 | R-64 | D-63 | 30.0 parts | Binder resin solution 1 | 15.7 parts | |
| Ex. 60 | R-65 | D-63 | 30.0 parts | Binder resin solution 1 | 22.5 parts | |
| Ex. 61 | R-66 | D-63 | 30.0 parts | Binder resin solution 1 | 22.0 parts | 0.2 parts |
| Ex. 62 | R-67 | D-63 | 30.0 parts | Binder resin solution 1 | 22.0 parts | |
| Ex. 63 | R-68 | D-63 | 30.0 parts | Binder resin solution 1 | 21.5 parts | 0.2 parts |
| Comp. Ex. 1 | R-57 | D-57 | 30.0 parts | Binder resin solution 2 | 13.9 parts | |
| Comp. Ex. 2 | R-58 | D-58 | 30.0 parts | Binder resin solution 7 | 13.9 parts | |
| Comp. Ex. 3 | R-59 | D-59 | 30.0 parts | Binder resin solution 6 | 13.9 parts | |
| Comp. Ex. 4 | R-60 | D-60 | 30.0 parts | Binder resin solution 1 | 13.9 parts | |
| Comp. Ex. 5 | R-61 | D-61 | 30.0 parts | Binder resin solution 1 | 13.9 parts | |

| | Ex-611 | Photopolymerizable monomer | | Photopolymerazation initiator | | PGMAc |
|---|---|---|---|---|---|---|
| | Amount | Type | Amount | Type | Amount | Amount |
| Ex. 1 | | M350 | 3.2 parts | OXE-01 | 0.2 parts | 52.7 parts |
| Ex. 2 | | M309 | 3.2 parts | OXE-01 | 0.2 parts | 52.7 parts |
| Ex. 3 | | M350 | 3.2 parts | Irg379 | 0.2 parts | 52.7 parts |
| Ex. 4 | | M350 | 3.2 parts | Irg907 | 0.2 parts | 52.7 parts |
| Ex. 5 | | M350 | 3.2 parts | OXE-01 | 0.2 parts | 53.3 parts |
| Ex. 6 | 0.2 parts | M350 | 3.2 parts | OXE-01 | 0.2 parts | 53.3 parts |
| Ex. 7 | | M350 | 3.2 parts | OXE-01 | 0.2 parts | 52.7 parts |
| Ex. 8 | | M309 | 3.2 parts | OXE-01 | 0.2 parts | 52.7 parts |
| Ex. 9 | | M350 | 3.2 parts | Irg379 | 0.2 parts | 52.7 parts |
| Ex. 10 | | M350 | 3.2 parts | Irg907 | 0.2 parts | 52.7 parts |
| Ex. 11 | | M350 | 3.2 parts | OXE-01 | 0.2 parts | 53.3 parts |
| Ex. 12 | 0.2 parts | M350 | 3.2 parts | OXE-01 | 0.2 parts | 53.3 parts |
| Ex. 13 | | M350 | 3.2 parts | OXE-01 | 0.2 parts | 52.7 parts |
| Ex. 14 | | M309 | 3.2 parts | OXE-01 | 0.2 parts | 52.7 parts |
| Ex. 15 | | M350 | 3.2 parts | Irg379 | 0.2 parts | 52.7 parts |
| Ex. 16 | | M350 | 3.2 parts | Irg907 | 0.2 parts | 52.7 parts |
| Ex. 17 | | M350 | 3.2 parts | OXE-01 | 0.2 parts | 53.3 parts |
| Ex. 18 | 0.2 parts | M350 | 3.2 parts | OXE-01 | 0.2 parts | 53.3 parts |
| Ex. 19 | | M350 | 3.2 parts | OXE-01 | 0.2 parts | 52.7 parts |
| Ex. 20 | | M309 | 3.2 parts | OXE-01 | 0.2 parts | 52.7 parts |
| Ex. 21 | | M350 | 3.2 parts | Irg379 | 0.2 parts | 52.7 parts |
| Ex. 22 | | M350 | 3.2 parts | Irg907 | 0.2 parts | 52.7 parts |
| Ex. 23 | | M350 | 3.2 parts | OXE-01 | 0.2 parts | 53.3 parts |
| Ex. 24 | 0.2 parts | M350 | 3.2 parts | OXE-01 | 0.2 parts | 53.3 parts |
| Ex. 25 | | M350 | 3.2 parts | OXE-01 | 0.2 parts | 52.7 parts |
| Ex. 26 | | M309 | 3.2 parts | OXE-01 | 0.2 parts | 52.7 parts |
| Ex. 27 | | M350 | 3.2 parts | Irg379 | 0.2 parts | 52.7 parts |
| Ex. 28 | | M350 | 3.2 parts | Irg907 | 0.2 parts | 52.7 parts |
| Ex. 29 | | M350 | 3.2 parts | OXE-01 | 0.2 parts | 53.3 parts |
| Ex. 30 | 0.2 parts | M350 | 3.2 parts | OXE-01 | 0.2 parts | 53.3 parts |
| Ex. 31 | | M350 | 3.2 parts | OXE-01 | 0.2 parts | 52.7 parts |
| Ex. 32 | | M309 | 3.2 parts | OXE-01 | 0.2 parts | 52.7 parts |
| Ex. 33 | | M350 | 3.2 parts | Irg379 | 0.2 parts | 52.7 parts |
| Ex. 34 | | M350 | 3.2 parts | Irg907 | 0.2 parts | 52.7 parts |
| Ex. 35 | | M350 | 3.2 parts | OXE-01 | 0.2 parts | 53.3 parts |
| Ex. 36 | 0.2 parts | M350 | 3.2 parts | OXE-01 | 0.2 parts | 53.3 parts |
| Ex. 37 | | M350 | 3.2 parts | OXE-01 | 0.2 parts | 52.7 parts |
| Ex. 38 | | M309 | 3.2 parts | OXE-01 | 0.2 parts | 52.7 parts |
| Ex. 39 | | M350 | 3.2 parts | Irg379 | 0.2 parts | 52.7 parts |
| Ex. 40 | | M350 | 3.2 parts | Irg907 | 0.2 parts | 52.7 parts |
| Ex. 41 | | M350 | 3.2 parts | OXE-01 | 0.2 parts | 53.3 parts |
| Ex. 42 | 0.2 parts | M350 | 3.2 parts | OXE-01 | 0.2 parts | 53.3 parts |
| Ex. 43 | | M350 | 3.2 parts | OXE-01 | 0.2 parts | 52.7 parts |
| Ex. 44 | | M309 | 3.2 parts | OXE-01 | 0.2 parts | 52.7 parts |
| Ex. 45 | | M350 | 3.2 parts | Irg379 | 0.2 parts | 52.7 parts |

TABLE 2-continued

| | | | | | | |
|---|---|---|---|---|---|---|
| Ex. 46 | | M350 | 3.2 parts | Irg907 | 0.2 parts | 52.7 parts |
| Ex. 47 | | M350 | 3.2 parts | OXE-01 | 0.2 parts | 53.3 parts |
| Ex. 48 | | M350 | 3.2 parts | OXE-01 | 0.2 parts | 52.7 parts |
| Ex. 49 | | M350 | 3.2 parts | OXE-01 | 0.2 parts | 52.7 parts |
| Ex. 50 | | M350 | 3.2 parts | OXE-01 | 0.2 parts | 52.7 parts |
| Ex. 51 | | M350 | 3.2 parts | OXE-01 | 0.2 parts | 50.9 parts |
| Ex. 52 | | M350 | 3.2 parts | OXE-01 | 0.2 parts | 50.9 parts |
| Ex. 53 | | M350 | 3.2 parts | OXE-01 | 0.2 parts | 52.7 parts |
| Ex. 54 | | | | | | 44.6 parts |
| Ex. 55 | | | | | | 44.6 parts |
| Ex. 56 | | | | | | 47.5 parts |
| Ex. 57 | | M350 | 3.2 parts | OXE-01 | 0.2 parts | 50.9 parts |
| Ex. 58 | | | | | | 47.5 parts |
| Ex. 59 | | M350 | 3.2 parts | OXE-01 | 0.2 parts | 50.9 parts |
| Ex. 60 | | | | | | 47.5 parts |
| Ex. 61 | | | | | | 47.8 parts |
| Ex. 62 | 0.2 parts | | | | | 47.8 parts |
| Ex. 63 | 0.2 parts | | | | | 48.1 parts |
| Comp. Ex. 1 | | M350 | 3.2 parts | OXE-01 | 0.2 parts | 52.7 parts |
| Comp. Ex. 2 | | M350 | 3.2 parts | OXE-01 | 0.2 parts | 52.7 parts |
| Comp. Ex. 3 | | M350 | 3.2 parts | OXE-01 | 0.2 parts | 52.7 parts |
| Comp. Ex. 4 | | M350 | 3.2 parts | OXE-01 | 0.2 parts | 52.7 parts |
| Comp. Ex. 5 | | M350 | 3.2 parts | OXE-01 | 0.2 parts | 52.7 parts |

<Evaluation of Photosensitive Near-Infrared Absorbing Compositions>

With respect to the photosensitive near-infrared absorbing compositions (R-1 to R-68) obtained in Examples and Comparative Examples, tests of the average primary particle diameter, spectral characteristics, resistance (light resistance and heat resistance), pattern peeling property (1 or 2), and pattern formability were carried out by the following method. The symbol "⊚" indicates a very good level, "○" indicates a good level, "Δ" indicates a practical level, and "×" indicates a level unsuitable for practical use. The results are shown in Table 3.

(Average Primary Particle Diameter at the Time of Dispersion of Near-Infrared Absorbing Dye [A])

The average primary particle diameter of the near-infrared absorbing dye [A] was measured by a method of directly measuring the size of primary particles from an electron micrograph using a transmission electron microscope (TEM). Specifically, the short axis diameter and the major axis diameter of the primary particles of each dye were measured, and the average was taken as the primary particle diameter of the dye. Next, with respect to 100 or more dye particles, the volume (weight) of each particle was obtained in approximation to the cube of the obtained particle diameter, and a volume average particle diameter was regarded as an average primary particle diameter.

(Evaluation of Spectral Characteristics)

The obtained near-infrared absorbing composition was spin-coated on a 1.1 mm thick glass substrate using a spin coater to a film thickness of 1.0 μm, dried at 60° C. for five minutes, and heated at 230° C. for five minutes to prepare a substrate. An absorption spectrum in the wavelength range of 300 to 900 nm of the spectrum of the obtained substrate was measured using a spectrophotometer (U-4100, produced by Hitachi High-Technologies Corporation). On the assumption that the absorbance at the maximum absorption wavelength was 1, the "average absorbance at 400 to 700 nm" was evaluated according to the following criteria. The maximum absorption wavelength of the near-infrared absorbing dye [A] coating film of the present specification is present in the near-infrared region (700 to 1000 nm). On the assumption that the absorbance is 1, the smaller the absorbance at 400 to 700 nm, the better the absorptivity in the near-infrared region, and the higher the coloring power and the sharper the spectrum.

⊚: Less than 0.05
○: 0.05 or more and less than 0.075
Δ: 0.075 or more and less than 0.1
×: 0.1 or more (Light Resistance Test)

A test substrate was prepared by the same procedure as in the valuation of spectral characteristics, placed in a light resistance tester ("SUNTEST CPS+" produced by TOYO-SEIKI CO., LTD.) and left to stand for 24 hours. The absorbance at the spectral maximum absorption wavelength of the near-infrared absorbing film was measured, the residual ratio relative to that before light irradiation was determined, and the light resistance was evaluated according to the following criteria. The residual rate was calculated using the following equation.

Residual rate=(absorbance after irradiation)/(absorbance before irradiation)×100

⊚: Residual ratio is 95% or more
○: Residual ratio is 90% or more and less than 95%
×: Residual ratio is less than 90%

(Heat Resistance Test)

A test substrate was prepared by the same procedure as in the valuation of spectral characteristics, and additionally heated at 210° C. for 20 minutes as a heat resistance test. The absorbance at the spectral maximum absorption wavelength of the near-infrared absorbing film was measured, the residual ratio relative to that before the heat resistance test was determined, and the heat resistance was evaluated according to the following criteria. The residual rate was calculated using the following equation.

Residual rate=(absorbance after heat resistance test)/(absorbance before heat resistance test)×100

⊚: Residual ratio is 95% or more
○: Residual ratio is 90% or more and less than 95%
×: Residual ratio is less than 90%

(Pattern Peeling Property 1)

After the photosensitive infrared absorbing compositions obtained by Examples 1 to 53, 57 and 59 and Comparative Examples 1 to 5 were applied onto 8 inch silicon wafers by spin coating, the surface of the coated film was heat-treated at 100° C. for 120 seconds on a hot plate and dried to form a dried coating film having a film thickness of about 1.0 μm.

[Formation of Infrared Absorption Pattern for Solid-State Imaging Device]

Next, the dried coating film was exposed at an exposure of 1000 mJ/cm$^2$ by an i-line stepper (FPA-3000i5+ produced by Canon Inc.) through a mask pattern, in which 2.0 μm square pixels were arrayed as dots in a region of 10 mm×10 mm on the substrate.

The pattern-exposed coating film was subjected to paddle development at room temperature for 60 seconds using an organic alkali developing solution (PK-DEX 4310, produced by Parker Corporation, Inc.), and further rinsed with pure water by a spin shower for 20 seconds. Thereafter, further washing with pure water was carried out. Then, water droplets were blown off with high pressure air, the substrate was naturally dried and post-baked with a hot plate at 230° C. for 300 seconds, and an infrared absorption pattern was formed on the silicon wafer.

With respect to the infrared absorption pattern prepared as described above, the number of occurrences of pattern peeling was inspected, defect portions were detected, and the number of defects due to peeling was extracted from these defect portions by a defect inspection apparatus "ComPLUS 3" produced by Applied Materials Technology Co., Ltd. Based on the number of peeling defects extracted, evaluation was conducted according to the following evaluation criteria. As for the inspection area, 200 regions of 10 mm in length×10 mm in width were produced on 8-inch wafers and evaluated.

⊚: Number of peeling defects is 5 or less
○: Number of peeling defects is 6 or more and 10 or less
Δ: Number of peeling defects is 11 or more and 20 or less
x: Number of peeling defects is 21 or more (Pattern Peeling Property 2 Dry Etching)

[Infrared Absorption Pattern Formation Process by Dry Etching]

(Formation of Layer)

The photosensitive infrared absorbing composition obtained by Examples 54 to 56, 58 and 60 to 63 was applied onto an 8 inch silicon wafer by spin coating, dried on a hot plate at 100° C. for 180 seconds, dried, and further heat-treated (post-baked) for 480 seconds using a hot plate at 200° C.

(Application of Mask Resist)

Next, a positive type photoresist "FHi 622 BC" (produced by FUJIFILM Electronic Materials Co., Ltd.) was applied onto the above layer, and prebaking was performed to form a photoresist layer.

(Pattern Exposure and Development of Mask Resist)

Subsequently, the photoresist layer was subjected to pattern exposure at an exposure of 350 mJ/cm$^2$ by an i-line stepper (produced by Canon Inc.), and heat treatment was performed for one minute at a temperature at which the photoresist layer or the atmosphere became 90° C. Thereafter, development treatment was performed with a developing solution "FHD-5" (produced by FUJIFILM Electronics Materials Co., Ltd.) for one minute and post-baking was performed at 110° C. for one minute to form a resist pattern. This resist pattern is a pattern in which square resist films are arranged in a checkerboard pattern in consideration of etching conversion difference (reduction in pattern width by etching).

(Dry Etching)

Next, using the resist pattern as an etching mask, dry etching was performed in the following procedure.

A first stage etching process of 80 seconds was carried out using a dry etching apparatus (U-621, produced by Hitachi High-Technologies Corporation) with RF power of 800 W, antenna bias of 400 W, wafer bias of 200 W, chamber internal pressure of 4.0 Pa, and substrate temperature of 50° C., and a mixed gas of the gas type and the flow rate were set to CF$_4$: 80 mL/min, O$_2$: 40 mL/min, and Ar: 800 mL/min.

The amount of etching of the layer under the etching conditions was 356 nm (etching amount of 89%), and in this state there was a residual film of about 44 nm.

Subsequently, a second stage etching process, that is, an overetching process was carried out in the same etching chamber with RF power of 600 W, antenna bias of 100 W, wafer bias of 250 W, internal pressure of the chamber of 2.0 Pa, and substrate temperature of 50° C., and a mixed gas of the gas type and the flow rate were set to N$_2$: 500 mL/min, O$_2$: 50 mL/min, and Ar: 500 mL/min (N$_2$/O$_2$/Ar=10/1/10), at the overetching rate in total etching of 20%.

The etching rate of the infrared absorption pattern layer under the etching conditions of the second stage was 600 nm/min or more, and it took about 10 seconds to etch the residual film of the layer. The etching time was calculated by adding 80 seconds of the first stage etching time and 10 seconds of the second stage etching time. As a result, the etching time was 80+10=90 seconds, the over etching time was 90×0.2=18 seconds, and the total etching time was set to 90+18=108 seconds.

After performing the dry etching under the above conditions, the resist pattern was removed by performing peeling treatment for 120 seconds using a photoresist peeling solution "MS 230 C" (produced by FUJIFILM Electronics Materials Co., Ltd.). Furthermore, washing with pure water and spin drying were carried out. Thereafter, dehydration baking treatment was carried out at 100° C. for two minutes.

With respect to the infrared absorption pattern prepared as described above, the number of occurrences of pattern peeling was evaluated in the same manner as described above (pattern peeling property 1).

(Pattern Forming Property)

The infrared absorption pattern produced at the evaluation of the pattern peeling property was cut out with a glass cutter and observed with a scanning-type electron microscope (S-4800, produced by Hitachi, Ltd.) at a magnification of 15,000 times, and evaluation was conducted according to the following evaluation criteria.

○: A pattern with a line width of 1.2 μm is formed with good linearity
Δ: A pattern with a line width of 1.2 μm has slight irregularities, but practically no problem
x: Linearity of a pattern with a line width of 1.2 μm is remarkably poor (Storage Stability)

The compositions of the examples and comparative examples described above were evaluated with respect to the viscosity immediately after preparation and the viscosity after storage at 40° C. for one week, according to the following evaluation criteria.

⊚: Increase rate of viscosity is less than 50
○: Increase rate of viscosity is 50 or more and 10% or less
Δ: Increase rate of viscosity is 11% or more and less than 30%
x: Increase rate of viscosity is 30% or more

TABLE 3

| | Photosensitive near-infrared absorbing composition | Near-infrared absorbing dye | Average primary particle diameter [nm] | Spectral characteristics | Light resistance | Heat resistance | Pattern peeling | Pattern formation | Storage stability |
|---|---|---|---|---|---|---|---|---|---|
| Ex. 1 | R-1 | A-1 | 57.8 | ◎ | ○ | ○ | ◎ | ○ | ◎ |
| Ex. 2 | R-2 | A-2 | 58.5 | ◎ | ○ | ○ | ◎ | ○ | ◎ |
| Ex. 3 | R-3 | A-3 | 35.6 | ◎ | ◎ | ◎ | ○ | ○ | ◎ |
| Ex. 4 | R-4 | A-3 | 32.2 | ◎ | ◎ | ◎ | ○ | ○ | ◎ |
| Ex. 5 | R-5 | A-3 | 34.1 | ◎ | ◎ | ◎ | Δ | Δ | ◎ |
| Ex. 6 | R-6 | A-3 | 38.9 | ○ | ○ | ○ | Δ | Δ | ◎ |
| Ex. 7 | R-7 | A-3 | 39.1 | ○ | ○ | ○ | ◎ | ○ | ◎ |
| Ex. 8 | R-8 | A-3 | 42.5 | Δ | ○ | ○ | ◎ | ○ | ◎ |
| Ex. 9 | R-9 | A-3 | 43.4 | Δ | ○ | ○ | ○ | ○ | ◎ |
| Ex. 10 | R-10 | A-3 | 41.4 | Δ | ○ | ○ | ○ | ○ | ◎ |
| Ex. 11 | R-11 | A-3 | 43.3 | Δ | ○ | ○ | ○ | ○ | ◎ |
| Ex. 12 | R-12 | A-4 | 59.4 | ◎ | ○ | ○ | ○ | ○ | ◎ |
| Ex. 13 | R-13 | A-5 | 36.0 | ◎ | ◎ | ◎ | Δ | Δ | ◎ |
| Ex. 14 | R-14 | A-5 | 32.5 | ◎ | ◎ | ◎ | Δ | Δ | ◎ |
| Ex. 15 | R-15 | A-5 | 34.4 | ◎ | ◎ | ◎ | ◎ | ○ | ◎ |
| Ex. 16 | R-16 | A-5 | 43.4 | Δ | ○ | ○ | ◎ | ○ | ◎ |
| Ex. 17 | R-17 | A-5 | 42.9 | Δ | ○ | ○ | ○ | ○ | ◎ |
| Ex. 18 | R-18 | A-5 | 43.2 | Δ | ○ | ○ | ○ | ○ | ◎ |
| Ex. 19 | R-19 | A-5 | 42.6 | Δ | ○ | ○ | Δ | Δ | ◎ |
| Ex. 20 | R-20 | A-5 | 43.3 | Δ | ○ | ○ | Δ | Δ | ◎ |
| Ex. 21 | R-21 | A-5 | 40.4 | Δ | ○ | ○ | Δ | Δ | ◎ |
| Ex. 22 | R-22 | A-6 | 54.2 | ◎ | ◎ | ○ | Δ | Δ | ◎ |
| Ex. 23 | R-23 | A-7 | 53.8 | ◎ | ◎ | ○ | ◎ | ○ | ◎ |
| Ex. 24 | R-24 | A-8 | 59.8 | ◎ | ○ | ○ | ◎ | ○ | ◎ |
| Ex. 25 | R-25 | A-9 | 57.7 | ◎ | ○ | ○ | ○ | ○ | ◎ |
| Ex. 26 | R-26 | A-10 | 58.3 | ◎ | ○ | ○ | ○ | ○ | ◎ |
| Ex. 27 | R-27 | A-11 | 68.5 | ◎ | ○ | ○ | Δ | Δ | ◎ |
| Ex. 28 | R-28 | A-12 | 72.1 | ◎ | ○ | ○ | Δ | Δ | ◎ |
| Ex. 29 | R-29 | A-13 | 69.4 | ◎ | ○ | ○ | ◎ | ○ | ◎ |
| Ex. 30 | R-30 | A-14 | 73.5 | ◎ | ○ | ○ | ◎ | ○ | ◎ |
| Ex. 31 | R-31 | A-15 | 72.0 | ◎ | ○ | ○ | ○ | ○ | ◎ |
| Ex. 32 | R-32 | A-16 | 69.0 | ◎ | ○ | ○ | ○ | ○ | ◎ |
| Ex. 33 | R-33 | A-17 | 68.0 | ◎ | ○ | ○ | Δ | Δ | ◎ |
| Ex. 34 | R-34 | A-18 | 74.7 | ◎ | ○ | ○ | Δ | Δ | ◎ |
| Ex. 35 | R-35 | A-19 | 73.6 | ◎ | ○ | ○ | ◎ | ○ | ◎ |
| Ex. 36 | R-36 | A-20 | 71.1 | ◎ | ○ | ○ | ◎ | ○ | ◎ |
| Ex. 37 | R-37 | A-21 | 70.9 | ◎ | ○ | ○ | ○ | ○ | ◎ |
| Ex. 38 | R-38 | A-22 | 72.2 | ◎ | ○ | ○ | ○ | ○ | ◎ |
| Ex. 39 | R-39 | A-23 | 74.3 | ◎ | ○ | ○ | Δ | Δ | ◎ |
| Ex. 40 | R-40 | A-24 | 69.9 | ◎ | ○ | ○ | Δ | Δ | ◎ |
| Ex. 41 | R-41 | A-25 | 69.2 | ◎ | ○ | ○ | ◎ | ○ | ◎ |
| Ex. 42 | R-42 | A-26 | 68.6 | ◎ | ○ | ○ | ◎ | ○ | ◎ |
| Ex. 43 | R-43 | A-27 | 66.9 | ◎ | ○ | ○ | ○ | ○ | ◎ |
| Ex. 44 | R-44 | A-28 | 70.4 | ◎ | ○ | ○ | ○ | ○ | ◎ |
| Ex. 45 | R-45 | A-29 | 70.8 | ◎ | ○ | ○ | Δ | Δ | ◎ |
| Ex. 46 | R-46 | A-30 | 71.1 | ◎ | ○ | ○ | Δ | Δ | ◎ |
| Ex. 47 | R-47 | A-31 | 71.8 | ◎ | ○ | ○ | ◎ | ○ | ◎ |
| Ex. 48 | R-48 | A-3 | 35.7 | ◎ | ◎ | ◎ | ○ | ○ | Δ |
| Ex. 49 | R-49 | A-3 | 31.2 | ◎ | ◎ | ◎ | ○ | ○ | ○ |
| Ex. 50 | R-50 | A-3 | 33.3 | ◎ | ◎ | ◎ | ○ | ○ | ○ |
| Ex. 51 | R-51 | A-3 | 34.1 | ◎ | ◎ | ◎ | ◎ | ○ | Δ |
| Ex. 52 | R-52 | A-3 | 37.3 | ◎ | ◎ | ◎ | ◎ | ○ | Δ |

TABLE 3-continued

| | Photosensitive near-infrared absorbing composition | Near-infrared absorbing dye | Average primary particle diameter [nm] | Spectral characteristics | Light resistance | Heat resistance | Pattern peeling | Pattern formation | Storage stability |
|---|---|---|---|---|---|---|---|---|---|
| Ex. 53 | R-53 | A-3 | 34.3 | ⊚ | ⊚ | ⊚ | ⊚ | ○ | ⊚ |
| Ex. 54 | R-54 | A-3 | 34.2 | ⊚ | ⊚ | ⊚ | ⊚ | ○ | Δ |
| Ex. 55 | R-55 | A-3 | 37.1 | ⊚ | ⊚ | ⊚ | ⊚ | ○ | Δ |
| Ex. 56 | R-56 | A-3 | 34.6 | ⊚ | ⊚ | ⊚ | ⊚ | ○ | ⊚ |
| Ex. 57 | R-62 | A-3 | 34.6 | ⊚ | ○ | ○ | ⊚ | ○ | Δ |
| Ex. 58 | R-63 | A-3 | 34.6 | ⊚ | ○ | ○ | ⊚ | ○ | Δ |
| Ex. 59 | R-64 | A-3 | 34.6 | ⊚ | ○ | ○ | ⊚ | ○ | ⊚ |
| Ex. 60 | R-65 | A-3 | 34.6 | ⊚ | ○ | ⊚ | ⊚ | ○ | ⊚ |
| Ex. 61 | R-66 | A-3 | 34.6 | ⊚ | ○ | ⊚ | ⊚ | ○ | ⊚ |
| Ex. 62 | R-67 | A-3 | 34.6 | ⊚ | ○ | ⊚ | ⊚ | ○ | ⊚ |
| Ex. 63 | R-68 | A-3 | 34.6 | ⊚ | ○ | ⊚ | ⊚ | ○ | ⊚ |
| Comp. ex. 1 | R-57 | A-3 | 31.4 | ⊚ | ⊚ | ⊚ | X | ○ | X |
| Comp. ex. 2 | R-58 | A-3 | 33.2 | ⊚ | ⊚ | ⊚ | X | ○ | X |
| Comp. ex. 3 | R-59 | A-3 | 32.8 | ⊚ | ⊚ | ⊚ | ○ | X | X |
| Comp. ex. 4 | R-60 | A-3 | 125.0 | X | ○ | ○ | ○ | ○ | X |
| Comp. ex. 5 | R-61 | A-5 | 120.0 | X | ○ | ○ | ○ | ○ | X |

The near-infrared absorbing composition including a near-infrared absorbing dye, a resin-based dispersant having an amine value of 20 to 200 (mg KOH/g), and a binder resin having an acid value of 130 mg KOH/g or less and a weight average molecular weight of 5,000 to 40,000 was very excellent in spectral characteristics. In particular, a resist (photosensitive composition) containing an oxime ester series photopolymerization initiator or an aminoketone series photopolymerization initiator and a photopolymerizable monomer having 3 to 12 ethylenic unsaturated double bond groups in one molecule, is low in absorption in the visible range (400 nm to 700 nm) and excellent in near-infrared absorptivity, has good spectral characteristics, and is also excellent in light resistance and heat resistance. Further, the near-infrared absorbing composition containing a copolymer composition of methacrylic acid and hydroxyethyl methacrylate as the binder resin and containing a resin having an acid value of 100 mg KOH/g or more has particularly good storage stability.

In addition, the near-infrared absorbing filter produced by using the photosensitive near-infrared absorbing composition is extremely excellent in spectral characteristics. Furthermore, it provides very good requisite performances that are important for use in solid-state imaging devices, such as pattern peeling property, pattern formation or storage stability. Moreover, it is excellent in light resistance and heat resistance; therefore, it is considered to be excellent in performances as a near-infrared absorbing filter for a solid-state imaging device.

The invention claimed is:

1. A near-infrared absorbing filter comprising a near-infrared absorbing composition for a solid-state imaging device,
    wherein the near-infrared absorbing composition comprises:
    a near-infrared absorbing dye [A] represented by General formula (1) below,
    a resin-based dispersant [B1] having an amine value in the range from 20 to 200 mg KOH/g,
    and a binder resin (C) having a weight average molecular weight in the range from 5,000 to 40,000 and an acid value of 130 mg KOH/g or less,

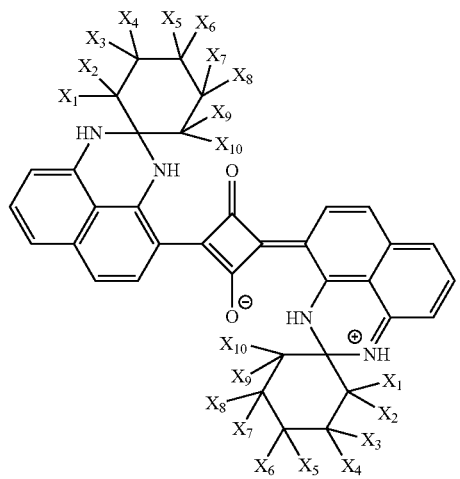

General formula (1)

wherein in General formula (1) $X_1$ to $X_{10}$ each independently represent a hydrogen atom, an alkyl group which may have a substituent, an alkenyl group which may have a substituent, an aryl group which may have a substituent, an aralkyl group which may have a substituent, an alkoxy group which may have a substituent, an aryloxy group which may have a substituent, an amino group, a substituted amino group, a sulfo group, $-SO_2NR_1R_2$, $-CONR_1R_2$, a nitro group, a cyano group, or a halogen atom; $R_1$ and $R_2$ each independently represent a hydrogen atom or an alkyl group which may have a substituent; and $X_1$ to $X_{10}$ may be bonded to each other to form a ring,
    wherein the resin-based dispersant [B1] comprises a tertiary amino group and a quaternary ammonium salt group.

2. A solid-state imaging device comprising the near-infrared absorbing filter according to claim 1 on a substrate.

3. The near-infrared absorbing filter according to claim 1, wherein the near-infrared absorbing composition further comprises a photopolymerizable monomer [D] and a photopolymerization initiator [E].

4. The near-infrared absorbing filter according to claim 3, wherein the photopolymerization initiator [E] comprises at least one selected from the group consisting of an oxime ester-series photopolymerization initiator [E1] and an aminoketone-series photopolymerization initiator [E2].

5. The near-infrared absorbing filter according to claim 3, wherein the photopolymerizable monomer [D] comprises a photopolymerizable monomer [D1] including 3 to 12 ethylenic unsaturated double bond groups in one molecule.

6. The near-infrared absorbing filter according to claim 1, wherein the near-infrared absorbing composition further comprises an epoxy resin [F].

7. The near-infrared absorbing filter according to claim 1, wherein the near-infrared absorbing composition further comprises a hindered phenol series antioxidant.

8. The near-infrared absorbing filter according to claim 1, wherein the binder resin [C] is a copolymer of monomers comprising (meth)acrylic acid and hydroxyethyl methacrylate and has an acid value in the range from 100 mg KOH/g to 130 mg KOH/g.

\* \* \* \* \*